(12) United States Patent
Lee et al.

(10) Patent No.: US 9,520,297 B2
(45) Date of Patent: Dec. 13, 2016

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Dong-Hun Lee, Anyang-si (KR); Sunhom Steve Paak, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/099,067

(22) Filed: Apr. 14, 2016

(65) Prior Publication Data

US 2016/0307767 A1 Oct. 20, 2016

(30) Foreign Application Priority Data

Apr. 15, 2015 (KR) ........................ 10-2015-0053023

(51) Int. Cl.
| | | |
|---|---|---|
| *H01L 21/336* | (2006.01) | |
| *H01L 21/308* | (2006.01) | |
| *H01L 29/66* | (2006.01) | |
| *H01L 21/306* | (2006.01) | |
| *H01L 21/762* | (2006.01) | |

(52) U.S. Cl.
CPC ..... *H01L 21/3085* (2013.01); *H01L 21/30604* (2013.01); *H01L 21/76224* (2013.01); *H01L 29/66553* (2013.01); *H01L 29/66795* (2013.01)

(58) Field of Classification Search
CPC .................................................. H01L 21/336
See application file for complete search history.

(56) References Cited

U.S. PATENT DOCUMENTS

| 8,334,211 | B2 | 12/2012 | Kewley |
|---|---|---|---|
| 8,486,840 | B2 | 7/2013 | Liaw |
| 8,617,996 | B1 | 12/2013 | Chi et al. |
| 8,669,186 | B2 | 3/2014 | LiCausi |
| 8,703,557 | B1 | 4/2014 | Cai et al. |
| 8,802,510 | B2 | 8/2014 | Chang et al. |
| 8,813,014 | B2 | 8/2014 | Yu et al. |
| 8,921,225 | B2 | 12/2014 | Yuan et al. |
| 2013/0277720 | A1 | 10/2013 | Kim et al. |
| 2014/0048804 | A1 | 2/2014 | Cheng et al. |
| 2014/0175565 | A1 | 6/2014 | Smayling et al. |

*Primary Examiner* — Marvin Payen
(74) *Attorney, Agent, or Firm* — Myers Bigel, P.A.

(57) ABSTRACT

A method of forming a semiconductor device includes sequentially forming a hard mask layer and a first sacrificial layer on a substrate, forming a first mandrel on the first sacrificial layer, forming a first spacer on both sidewalls of the first mandrel, removing the first mandrel, forming a second mandrel by etching the first sacrificial layer using the first spacer as an etch mask, forming a second spacer on both sidewalls of the second mandrel, removing the second mandrel, forming a hard mask pattern by patterning the hard mask layer using the second spacer as an etch mask, the hard mask pattern including first to ninth fin-type mask patterns extending to be parallel with each other in a first direction and sequentially spaced apart from each other in a second direction perpendicular to the first direction, removing the third, fifth and seventh fin-type mask patterns, forming first to sixth active patterns by etching the substrate using the hard mask pattern as an etch mask, and forming a first gate electrode extending in the second direction to intersect the first to fourth active patterns and a second gate electrode extending in the second direction to intersect the third to sixth active patterns and spaced apart from the first gate electrode in the first direction without intersecting the first and second active patterns.

20 Claims, 29 Drawing Sheets

| SMC1 | SMC2 | ····· | MR |
| :---: | :---: | :---: |
| ⋮ | ⋮ | ⋮ |

SEMICONDUCTOR DEVICE AND METHOD OF FABRICATING THE SAME

CROSS-REFERENCE TO RELATED APPLICATION

This application claims priority from Korean Patent Application No. 10-2015-0053023 filed on Apr. 15, 2015 in the Korean Intellectual Property Office, and all the benefits accruing therefrom under 35 U.S.C. 119, the contents of which in its entirety are herein incorporated by reference.

BACKGROUND

1. Field of the Invention

The present inventive concept relates to a semiconductor device and a method of fabricating the same.

2. Description of the Related Art

One of the scaling techniques that has been proposed for increasing the density of integrated circuit devices involves a multi-gate transistor in which a fin- or nanowire-shaped silicon body is formed on a substrate and a gate is then formed on a surface of the silicon body.

Because the multi-gate transistor uses a three-dimensional (3D) channel, scaling of the multi-gate transistor may be easily achieved. In addition, current controlling capability can be improved even without increasing a gate length of the multi-gate transistor. Further, a short channel effect (SCE), in which an electric potential of a channel region is affected by a drain voltage, can be effectively suppressed.

SUMMARY

The present inventive concept may provide a semiconductor device having improved operating characteristics.

The present inventive concept may also provide a method of fabricating a semiconductor device having improved operating characteristics.

According to an aspect of the present inventive concept, there is provided a method of fabricating a semiconductor device, the method comprising sequentially forming a hard mask layer and a first sacrificial layer on a substrate, forming a first mandrel on the first sacrificial layer, forming a first spacer on both sidewalls of the first mandrel, removing the first mandrel, forming a second mandrel by etching the first sacrificial layer using the first spacer as an etch mask, forming a second spacer on both sidewalls of the second mandrel, removing the second mandrel, forming a hard mask pattern by patterning the hard mask layer using the second spacer as an etch mask, the hard mask pattern including first to ninth fin-type mask patterns extending to be parallel with each other in a first direction and sequentially spaced apart from each other in a second direction perpendicular to the first direction, removing the third, fifth and seventh fin-type mask patterns, forming first to sixth active patterns by etching the substrate using the hard mask pattern as an etch mask and forming a first gate electrode extending in the second direction to intersect the first to fourth active patterns and a second gate electrode extending in the second direction to intersect the third to sixth active patterns and spaced apart from the first gate electrode in the first direction without intersecting the first and second active patterns.

In some embodiments of the present inventive concept, the forming of the first mandrel comprises forming a second sacrificial layer on the first sacrificial layer and forming the first mandrel by etching the second sacrificial layer.

In some embodiments of the present inventive concept, the method may further comprise forming an anti-reflection layer between the first and second sacrificial layers.

In some embodiments of the present inventive concept, a distance between the first active pattern and the second active pattern is less than 40 nm.

In some embodiments of the present inventive concept, the method may further comprise forming an isolation layer to allow the first to sixth active patterns to protrude from the isolation layer.

In some embodiments of the present inventive concept, the forming of the isolation layer comprises forming a deep trench on both side surfaces of the active patterns and forming the isolation layer to completely fill the deep trench.

In some embodiments of the present inventive concept, a top surface of the substrate between each of the second to fifth active patterns is lower than or at a same height as a top surface of the substrate between the first and second active patterns.

In some embodiments of the present inventive concept, the hard mask pattern comprises first to sixth hard mask patterns corresponding to the first to sixth active patterns, a distance between the first and second hard mask pattern is a first distance, and a distance between each of the second to fifth hard mask pattern is about twice the first distance.

In some embodiments of the present inventive concept, the first spacer is formed by atomic layer deposition (ALD).

According to another aspect of the present inventive concept, there is provided a method of fabricating a semiconductor device, the method comprising sequentially forming a hard mask layer and a sacrificial layer on a substrate, forming a first mandrel on the sacrificial layer, forming a second mandrel spaced apart from the first mandrel by a width of the first mandrel, forming fin-type patterns spaced apart from each other by a width of the second mandrel, forming first to sixth active fins using the fin-type patterns as etch masks, the first to sixth active fins extending to be parallel with each other in a first direction and sequentially spaced apart from each other in a second direction intersecting the first direction without a step difference formed on a top surface of the substrate between each of the first to sixth active fins and forming a first gate electrode extending in the second direction to intersect the first to fourth active patterns and a second gate electrode extending in the second direction to intersect the third to sixth active patterns and spaced apart from the first gate electrode in the first direction without intersecting the first and second active patterns.

In some embodiments of the present inventive concept, the method may further comprise forming an isolation layer on both side surfaces of the first to sixth active patterns.

In some embodiments of the present inventive concept, the forming of the isolation layer comprises forming a trench on both side surfaces of the first to sixth active fins and filling the trench with the isolation layer.

In some embodiments of the present inventive concept, the top surface of the substrate between the first to sixth active fins is higher than a bottom surface of the trench.

In some embodiments of the present inventive concept, the distance between the first and second active fins is about half a distance between the second and third active fins.

In some embodiments of the present inventive concept, distances between the second to fifth active fins are about equal.

In some embodiments of the present inventive concept, the second mandrel includes a plurality of second mandrels and the plurality of second mandrels have about a same width.

In some embodiments of the present inventive concept, the forming of the fin-type patterns comprises forming a plurality of pre-patterns spaced apart from each other; and forming the fin-type patterns by removing some of the plurality of pre-patterns.

In some embodiments of the present inventive concept, the plurality of pre-patterns is formed at about equal distances.

According to still another aspect of the present inventive concept, there is provided a method of fabricating a semiconductor device, the method comprising sequentially forming a hard mask layer and a sacrificial layer on a substrate, forming a first mandrel on the sacrificial layer, forming a second mandrel spaced apart from the first mandrel by a width of the first mandrel, forming fin-type patterns spaced apart from each other by a width of the second mandrel, forming a mask pattern by etching some of the fin-type patterns, forming first to sixth active fins using the mask pattern as an etch mask, the first to sixth active fins extending to be parallel with each other in a first direction and spaced apart from each other in a second direction intersecting the first direction; and forming a first gate electrode extending in the second direction to intersect the first to fourth active patterns and a second gate electrode extending in the second direction to intersect the third to sixth active patterns and spaced apart from the first gate electrode in the first direction without intersecting the first and second active patterns, wherein a distance between the first and second active fins and a distance between the fifth and sixth active fins are a first distance, and a distance between each of the second to fifth active fins is about twice the first distance.

In some embodiments of the present inventive concept, the mask pattern includes first to sixth mask patterns, a distance between the first and second mask patterns and a distance between the fifth and sixth mask patterns are the first distance, and a distance between each of the second to fifth mask patterns is about twice the first distance.

In some embodiments of the present inventive concept, the hard mask layer comprises at least one of silicon oxide (SiOx), silicon oxynitride (SiON), silicon nitride (SixNy), tetraethylorthosilicate (TEOS) and polysilicon, a carbon-containing material including amorphous carbon layer (ACL), a spin-on hardmask (SOH), and a metal.

In some embodiments of the present inventive concept, the hard mask layer comprises first to third hard mask layers sequentially stacked on the substrate, and the first to third hard mask layers comprise different materials.

In some embodiments of the present inventive concept, the first hard mask layer comprises silicon nitride, the second hard mask layer comprises silicon oxide, and the third hard mask layer comprises polysilicon.

According to an aspect of the present inventive concept, there is provided a semiconductor device comprising first to sixth active fins extending on a substrate to be parallel with each other in a first direction, a first gate electrode extending in a second direction intersecting the first direction and intersecting the first to fourth active fins; and a second gate electrode extending in the second direction to intersect the third to sixth active fins and spaced apart from the first gate electrode in the first direction without intersecting the first and second active fins, wherein a step is not formed on a top surface of the substrate between the first to sixth active fins.

In some embodiments of the present inventive concept, the semiconductor device may further comprise a deep trench formed on both side surfaces of active patterns including the first to sixth active fins.

In some embodiments of the present inventive concept, the semiconductor device may further comprise an isolation layer that fills the deep trench such that top portions of the first to sixth active patterns protrude from the isolation layer.

In some embodiments of the present inventive concept, lengths of the first and second active fins are different from those of the third and fourth active fins.

In some embodiments of the present inventive concept, the first to sixth active fins are formed by a self aligned quadruple patterning (SAQP) process.

In some embodiments of the present inventive concept, a distance of the first and second active fins is a first distance, and a distance between the second and third active fins is about twice the first distance.

In some embodiments of the present inventive concept, a portion of the third active fin overlaps a portion of the fourth active fin in a second direction.

In some embodiments of the present inventive concept, the first and second active fins and the first gate electrode intersect each other to define a first transistor, the third active fin and the first gate electrode intersect each other to define a second transistor, and the fourth active fin and the second gate electrode intersect each other to define a third transistor.

In some embodiments of the present inventive concept, a conductivity type of the first transistor is different from conductivity types of the second and third transistors.

In some embodiments of the present inventive concept, the conductivity type of the first transistor is an N type and the conductivity types of the second and third transistors are P type.

In some embodiments of the present inventive concept, the semiconductor device may further comprise an impurity epitaxial layer formed on the first to sixth active fins, wherein a conductivity type of the impurity epitaxial layer formed on the first and second active fins and the fifth and sixth active fins is different from that of the impurity epitaxial layer formed on the third and fourth active fins.

In some embodiments of the present inventive concept, the semiconductor device may further comprise a memory cell array region and a peripheral region, wherein the memory cell array region comprises a plurality of memory cell regions, and each of the memory cell regions comprises the first to sixth active fins and the first and second gate electrodes.

BRIEF DESCRIPTION OF THE DRAWINGS

The above and other features and advantages of the present inventive concept will become more apparent by describing in detail embodiments thereof with reference to the attached drawings in which:

FIG. 2 is a conceptual view illustrating a memory cell array region of FIG. 1;

DETAILED DESCRIPTION OF THE EMBODIMENTS

Figure 1:
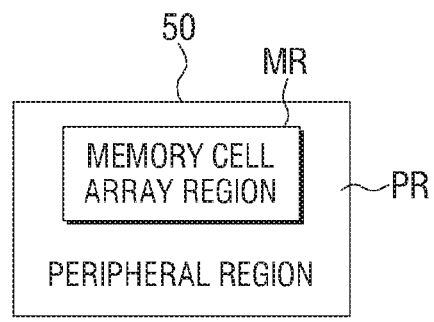
FIG. 1 is a conceptual view illustrating a semiconductor device according to an embodiment of the present inventive concept.

The present inventive concept will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout the description. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and this specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Hereinafter, a semiconductor device according to an embodiment of the present inventive concept will be described with reference to the accompanying drawings.

Figure 2:
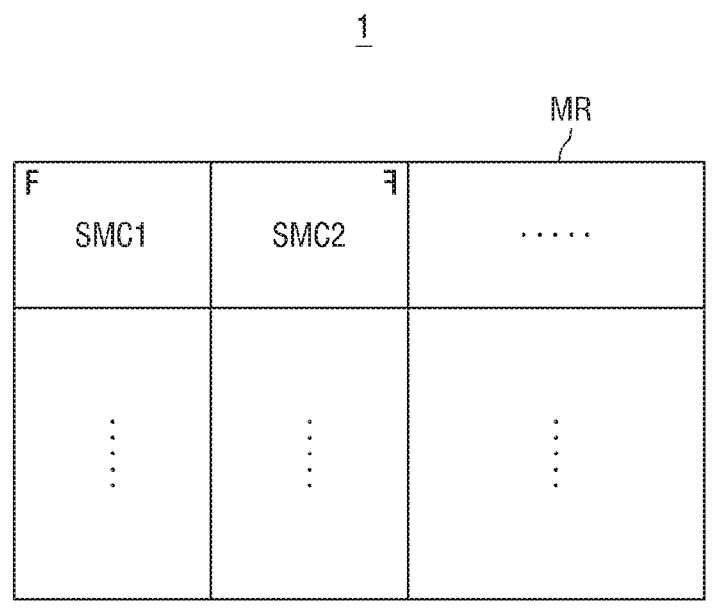

FIG. 1 is a conceptual view illustrating a semiconductor device according to an embodiment of the present inventive concept and FIG. 2 is a conceptual view illustrating a memory cell array region of FIG. 1.

Referring to FIG. 1, the semiconductor device 1 may include a memory cell array region MR and a peripheral region PR. In detail, the memory cell array region MR and the peripheral region PR may be disposed on a substrate 100 of the semiconductor device 1.

A memory device may be disposed on the memory cell array region MR. Examples of the memory device may include a static random access memory (SRAM), a dynamic random access memory (DRAM), a NAND or NOR flash memory, a magnetic random access memory (MRAM), a phase change random access memory (PRAM), a resistive random access memory (RRAM), and so on, but embodiments of the present disclosure are not limited thereto.

Various devices used to drive the memory device disposed on the memory cell array region MR may be disposed on the peripheral region PR. Examples of the devices may include an input/output (I/O) buffer, a read circuit, and a write circuit, but embodiments of the present disclosure are not limited thereto.

Referring to FIG. 2, the memory cell array region MR may include a plurality of memory cell regions.

The following description will be made with regard to a case where SRAM devices are disposed on each of the memory cell regions of the memory cell array region MR, but embodiments of the present disclosure are not limited thereto. That is to say, the following description will be made with regard to a case where the memory cell array region MR includes a plurality of SRAM memory cell regions SMC1 and SMC2, but embodiments of the present disclosure are not limited thereto.

As shown in FIG. 2, the plurality of SRAM memory cell regions SMC1 and SMC2 may be aligned in a lattice configuration to have an array configuration. SRAM cells may be arranged in the respective SRAM memory cell regions SMC1 and SMC2.

Hereinafter, the SRAM cell will be described in more detail with reference to FIGS. 3 to 6.

Figure 3:
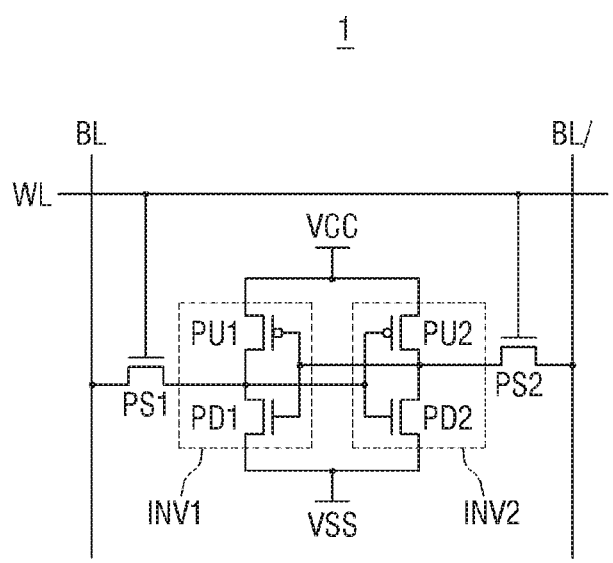
FIG. 3 is a circuit view illustrating an SRAM memory cell region of FIG. 2.
Figure 4:
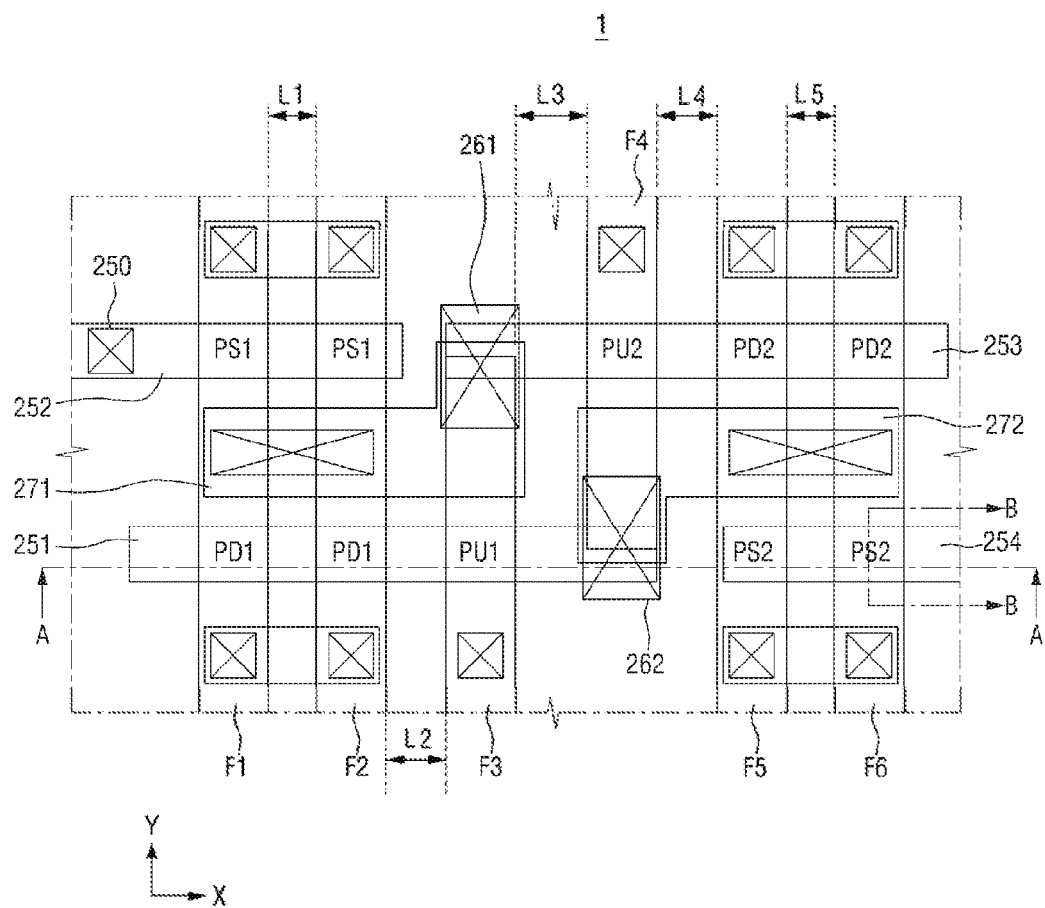
FIG. 4 is a layout view illustrating an SRAM memory cell region of FIG. 2.
Figure 5:
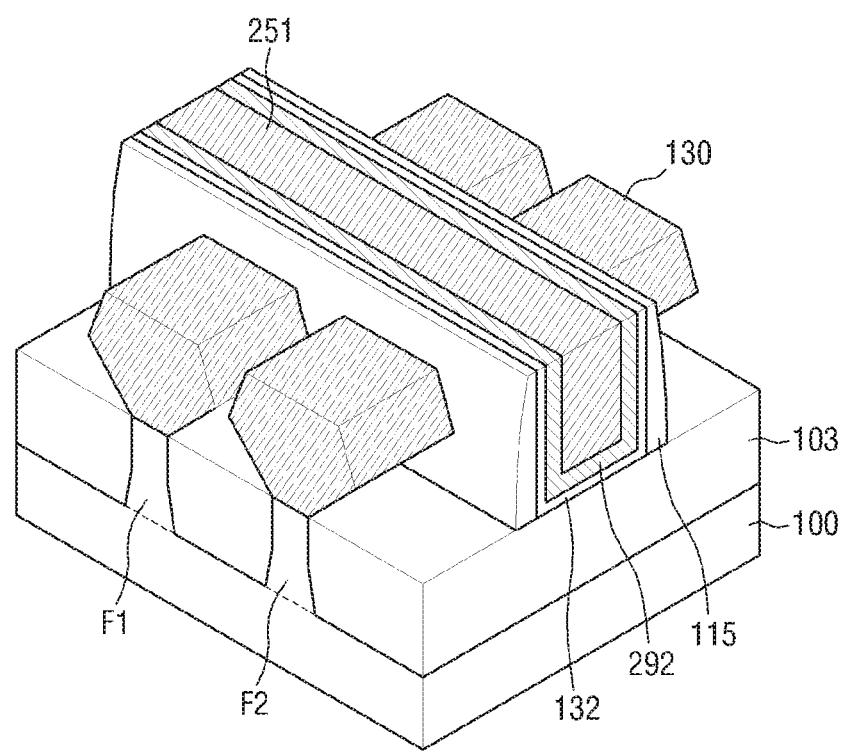
FIG. 5 is a perspective view illustrating a pull-down transistor of FIG. 4.
Figure 6:
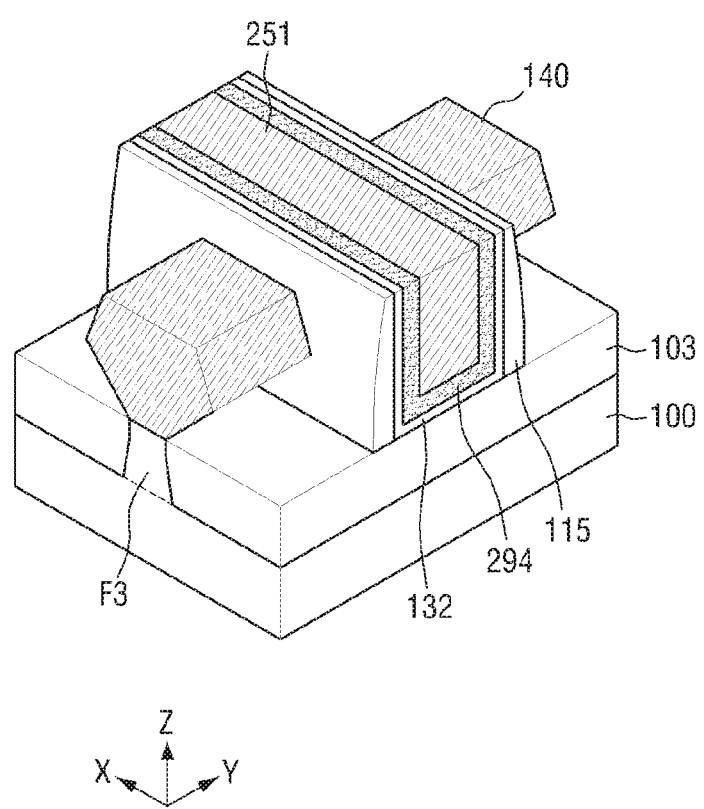
FIG. 6 is a perspective view illustrating a pull-up transistor of FIG. 4.

FIG. 3 is a circuit view illustrating an SRAM memory cell region of FIG. 2, FIG. 4 is a layout view illustrating an SRAM memory cell region of FIG. 2, FIG. 5 is a perspective view illustrating a pull-down transistor of FIG. 4, and FIG. 6 is a perspective view illustrating a pull-up transistor of FIG. 4.

First, referring to FIG. 3, the semiconductor device 1 may include a pair of inverters INV1 and INV2 connected in parallel between a power supply node VCC and a ground node VSS, and a first pass transistor PS1 and a second pass transistor PS2 connected to output nodes of the inverters INV1 and INV2.

The first pass transistor PS1 and the second pass transistor PS2 may be connected to a bit line BL and a complementary bit line BL/. Gates of the first pass transistor PS1 and the second pass transistor PS2 may be connected to a word line WL.

The first inverter INV1 includes a first pull-up transistor PU1 and a first pull-down transistor PD1 connected in series to each other between the power supply node VCC and the ground node VSS, and the second inverter INV2 includes a second pull-up transistor PU2 and a second pull-down transistor PD2 connected in series to each other between the power supply node VCC and the ground node VSS.

In embodiments of the present inventive concept, the first pull-up transistor PU1 and the second pull-up transistor PU2 may be PFET transistors, and the first pull-down transistor PD1 and the second pull-down transistor PD2 may be NFET transistors.

In addition, to constitute a latch circuit, an input node of the first inverter INV1 is connected to an output node of the second inverter INV2 and an input node of the second inverter INV2 is connected to an output node of the first inverter INV1.

Referring to FIGS. 3 to 7, a first active fin F1, a second active fin F2, a third active fin F3, a fourth active fin F4, fifth active fin F5, and a sixth active fin F6, which are spaced apart from one another, may extend lengthwise in a first direction X and may extend lengthwise in a second direction Y.

In some embodiments of the present inventive concept, as shown, the third active fin F3 and the fourth active fin F4 may extend in smaller lengths than the other active fins F1, F2, F5, and F6.

The first active fin F1 and the second active fin F2 may be spaced a first distance L1 apart from each other. The second active fin F2 and the third active fin F3 may be spaced a second distance L2 apart from each other. The third active fin F3 and the fourth active fin F4 may be spaced a third distance L3 apart from each other. The fourth active fin F4 and the fifth active fin F5 may be spaced a fourth distance L4 apart from each other. In addition, the fifth active fin F5 and the sixth active fin F6 may be spaced a fifth distance L5 apart from each other. The fifth distance L5 may be equal to the first distance L1.

Here, the second distance L2 may be greater than the first distance L1. That is to say, the first distance L1 may be smaller than the second distance L2. Accordingly, the first and second active fins F1 and F2 may be disposed to be closer to each other than the third and fourth active fins F3 and F4, and the fifth and sixth active fins F5 and F6 may be disposed to be closer to each other than the third and fourth active fins F3 and F4.

In addition, the third distance L3 may be greater than the first distance L1, the fourth distance L4 may also be greater than the first distance L1, and the fourth distance L4 may be equal to the second distance L2, but embodiments of the present disclosure are not limited thereto. The fourth distance L4 may be different from the second distance L2.

The third distance L3 may be different from the second distance L2 and the fourth distance L4, but embodiments of the present disclosure are not limited thereto.

A first gate electrode 251, a second gate electrode 252, a third gate electrode 253, and a fourth gate electrode 254 may extend lengthwise in the first direction X.

The first gate electrode 251 may be spaced apart from the fourth gate electrode 254 in the first direction X, and the second and third gate electrodes 252 and 253 may be spaced apart from each other in the second direction Y. The second gate electrode 252 may be spaced apart from the third gate electrode 253 in the first direction X, and the first and fourth gate electrodes 251 and 254 may be spaced apart from each other in the second direction Y.

The first gate electrode 251 may intersect the first to fourth active fins F1, F2, F3, and F4. The second gate electrode 252 may intersect the first and second active fins F1 and F2. The third gate electrode 253 may intersect the third to sixth active fins F3, F4, F5, and F6. The fourth gate electrode 254 may intersect the fifth and sixth active fins F5 and F6.

In detail, the first gate electrode 251 may completely intersect the first to third active fins F1, F2, and F3, while partially overlapping a terminal of the fourth active fin F4. The third gate electrode 253 may completely intersect the fourth to sixth active fins F4, F5, and F6, while partially overlapping a terminal of the third active fin F3.

As shown, the first pull-down transistor PD1 may be defined in the vicinity of intersections of the first gate electrode 251 and the first and second active fins F1 and F2.

The first pull-down transistor PD1 may include the first and second active fins F1 and F2, the first gate electrode 251, a first work function control layer 292, a gate insulation layer 132, a spacer 115, and a first impurity epitaxial layer 130.

The first and second active fins F1 and F2 may protrude from the substrate 100 in a third direction (Z) and may extend in the second direction Y.

In some embodiments of the present inventive concept, the substrate 100 may include a semiconductor material. The semiconductor material may include, for example, one or more materials selected from the group consisting of Si, Ge, SiGe, GaP, GaAs, SiC, SiGeC, InAs and InP, but embodiments of the present disclosure are not limited thereto. In some other embodiments of the present inventive concept, the substrate 100 may be an insulating substrate. That is to say, the substrate 100 may be, for example, a silicon on insulator (SOI) substrate. When the substrate 100 is an SOI substrate, the response speed of the semiconductor device may be improved.

Each of the first and second active fins F1 and F2 may have long sides and short sides.

In FIG. 4, the long sides of the first and second active fins F1 and F2 extending in the second direction Y and the short sides of the first and second active fins F1 and F2 extending in the first direction X are illustrated, but embodiments of the present disclosure are not limited thereto.

In some other embodiments of the present inventive concept, the long sides of the first and second active fins F1 and F2 may extend in the first direction X and the short sides of the first and second active fins F1 and F2 may extend in the second direction Y.

The first and second active fins F1 and F2 may be portions of the substrate 100 and may include epitaxial layers grown from the substrate 100.

In some embodiments of the present inventive concept, the first and second active fins F1 and F2 may include a semiconductor material. In this case, the first and second active fins F1 and F2 may include, for example, Si or SiGe.

In some embodiments of the present inventive concept, the first and second active fins F1 and F2 may include the same material as the substrate 100. For example, when the substrate 100 includes silicon (Si), the first and second active fins F1 and F2 may also include Si, but embodiments of the present disclosure are not limited thereto.

The substrate 100 and the first and second active fins F1 and F2 may include different materials.

For example, when the substrate 100 includes Si, the first and second active fins F1 and F2 may include a different semiconductor material from Si. In this case, the first and second active fins F1 and F2 may be formed on the substrate 100 by, for example, an epitaxial growth process.

An isolation layer 103 formed on the substrate 100 may cover portions of sidewalls of the first and second active fins F1 and F2 while exposing top portions of the first and second active fins F1 and F2. That is to say, as shown, the first field insulation layer 103 may cover bottom portions of the first and second active fins F1 and F2.

In some embodiments of the present inventive concept, the first field insulation layer 103 may include, for example, one of an oxide layer, an oxynitride layer, and a nitride layer, but aspects of the present disclosure are not limited thereto.

The gate insulation layer 132, the first work function control layer 292 and the first gate electrode 251 intersecting the first and second active fins F1 and F2 may be disposed on the first and second active fins F1 and F2.

As shown in FIG. 3, the gate insulation layer 132 is formed on top surfaces of the first and second active fins F1 and F2 and may protrude from the substrate 100 along sidewalls of the spacer 115. In other words, the gate insulation layer 132 may be configured such that at least one end of the gate insulation layer 132 extends to an upper portion of the substrate 100.

Such a configuration of the gate insulation layer 132 may be attributed to the first pull-down transistor PD1 according to an embodiment of the present inventive concept, which is formed by, for example, a gate replacement process.

In addition, the gate insulation layer 132 may be formed along a top surface of the isolation layer 103 and side surfaces and top surfaces of the first and second active fins F1 and F2.

The gate insulation layer 132 may include a high-k layer. The high-k layer may include an insulating material having a higher dielectric constant than silicon oxide. For example, the gate insulation layer 132 may include $HfO_2$, $ZrO_2$, LaO, $AP_2O_3$ or $Ta_2O_5$, but embodiments of the present disclosure are not limited thereto.

The first work function control layer 292 may be formed on the gate insulation layer 132. The first work function control layer 292 may control a work function of the first pull-down transistor PD1 and the first gate electrode 251 may transfer an externally applied gate voltage. In addition, the first gate electrode 251 may fill a space formed by the first work function control layer 292.

In some embodiments of the present inventive concept, the first work function control layer 292 may include a first metal and the first gate electrode 251 may include a second metal.

As shown in FIG. 5, the first work function control layer 292 may be formed to upwardly extend along the top surface of the gate insulation layer 132 and side surfaces of the first gate electrode 251. Such a configuration of the first work function control layer 292 may be attributed to the first pull-down transistor PD1 according to an embodiment of the present inventive concept, which is formed by, for example, a gate replacement process.

Figure 7:
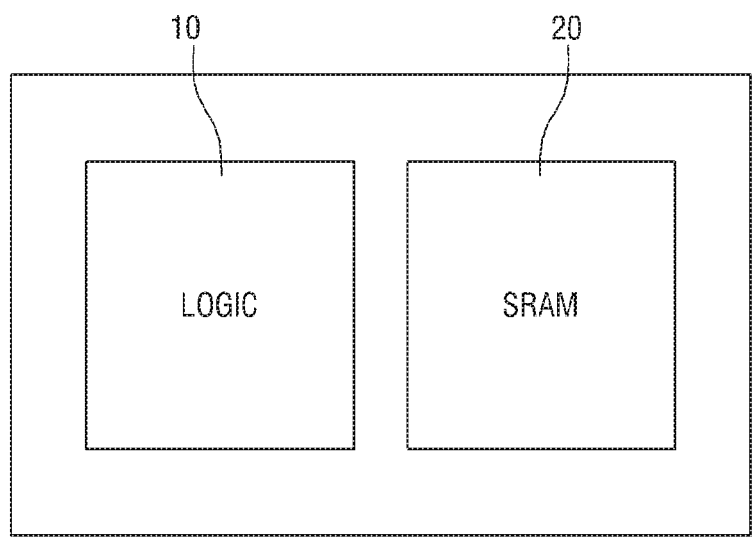
FIG. 7 is a conceptual view illustrating a semiconductor device according to another embodiment of the present inventive concept.

In addition, as shown in FIG. 7, the first work function control layer 292 may be conformally formed along the top surface of the first field insulation layer 103 and the sidewalls and top portions of the first and second active fins F1 and F2.

The first work function control layer 292 may include, for example, an N-type work function control layer. The first work function control layer 292 may include, for example, at least one of TiN, TaN, TiC, TiAlC and TaC.

The first gate electrode 251 may include, for example, W or Al, but embodiments of the present disclosure are not limited thereto. The configurations of the first work function control layer 292 and the first gate electrode 251 may vary.

Meanwhile, in some other embodiments of the present inventive concept, the first gate electrode 251 may include, for example, a non-metal material, such as Si or SiGe.

The spacer 115 may be formed on at least one side of the first gate electrode 251. In some embodiments of the present inventive concept, the spacer 115 may be formed on both sides of the first gate electrode 251. In the illustrated embodiment, the spacer 115 shaped of a pillar is exemplified, but aspects of the present disclosure are not limited thereto. In some other embodiments of the present inventive concept, the shape of the spacer 115 may vary in many ways.

In the present embodiment, the spacer 115 may include, for example, a nitride layer. In detail, the spacer 115 may include a silicon nitride layer, but embodiments of the present disclosure are not limited thereto. The material for forming the spacer 115 may vary. For example, in some embodiments of the present inventive concept, the spacer 115 may include one of an oxide layer and an oxynitride layer.

The first impurity epitaxial layer 130 may be formed on the first and second active fins F1 and F2 disposed at both sides of the spacer 115.

In some embodiments of the present inventive concept, the first impurity epitaxial layer 130 may be formed on regions produced when the first and second active fins F1 and F2 are partially etched. The first impurity epitaxial layer 130 may be formed on the first and second active fins F1 and F2 by, for example, an epitaxial growth process.

In some embodiments of the present inventive concept, the first impurity epitaxial layer 130 may be an elevated source or drain region. That is to say, a top surface of the first impurity epitaxial layer 130 may be higher than the top surfaces of the first and second active fins F1 and F2.

The first impurity epitaxial layer 130 may include a semiconductor material. In some embodiments of the present inventive concept, the first impurity epitaxial layer 130 may include, for example, Si, but aspects of the present disclosure are not limited thereto.

In some embodiments of the present inventive concept, the first impurity epitaxial layer 130 may include the same material as the substrate 100 or a tensile stress material. For example, when the substrate 100 includes Si, the first impurity epitaxial layer 130 includes a material having a smaller lattice constant than Si (e.g., SiC or SiP).

The tensile stress material may improve the mobility of carriers of channel regions defined in the first and second active fins F1 and F2 by applying tensile stress to the channel regions.

Referring again to FIG. 4, the first pull-up transistor PU1 may be defined at an intersection of the first gate electrode 251 and the third active fin F3.

The first pull-up transistor PU1 may include the third active fin F3, the first gate electrode 251, a second work function control layer 294, the gate insulation layer 132, the spacer 115, and a second impurity epitaxial layer 140.

The third active fin F3, the first gate electrode 251, the gate insulation layer 132, and the spacer 115 are the same as described above, repeated descriptions thereof will not be given.

The second work function control layer 294 may control a work function of the first pull-up transistor PU1. In some embodiments of the present inventive concept, the second work function control layer 294 may include a third metal different from the first metal included in the first work function control layer 292.

The second work function control layer 294 may include, for example, a P-type work function control layer. The second work function control layer 294 may include, for example, at least one of TiN, TaN, TiC, TiAlC and TaC.

The second impurity epitaxial layer 140 may include a compressive stress material. For example, the compressive stress material may include a material having a larger lattice constant than Si, e.g., SiGe.

The compressive stress material may improve the mobility of carriers of a channel region defined in the third active fin F3 by applying compressive stress to the channel region.

In detail, because the distance L1 between the first active fin F1 and the second active fin F2 is relatively small, the top surface of the substrate 100 between the first active fin F1 and the second active fin F2 may be relatively high. However, because the distance L3 between the third active fin F3 and the fourth active fin F4 is relatively large, the top surface of the substrate 100 between the third active fin F3 and the fourth active fin F4 may be lower than or at the same height as the top surface of the substrate 100 between the first active fin F1 and the second active fin F2.

Accordingly, in the present embodiment, channel regions of the first and second active fins F1 and F2 operating as NFETs may be smaller than a channel region of the third active fin F3 operating as a PFET.

An electron is used as a carrier in the NFET and a hole is used as a carrier in the PFET. Therefore, when the NFET and the PFET have the same channel structure, operating characteristics of the NFET and the PFET may differ due to a difference in the carrier mobility.

Referring again to FIG. 4, the second pull-up transistor PU2 may be defined at an intersection of the third gate electrode 253 and the fourth active fin F4. The second pull-down transistor PD2 may be defined at intersections of the third gate electrode 253 and the fifth and sixth active fins F5 and F6.

Because the second pull-up transistor PU2 has substantially the same configuration as the aforementioned first pull-up transistor PU1 and the second pull-down transistor PD2 has substantially the same configuration as the aforementioned first pull-down transistor PD1, repeated descriptions thereof will not be given.

As shown in FIG. 4, the semiconductor device 1 may include, for example, a first region in which the first and second pull-down transistors PD1 and PD2 operating as NFETs are defined, and a second region in which the first and second pull-up transistors PD1 and PD2 operating as PFETs are defined. Here, the distance L1 and L5 between each of the active fins (e.g., F1, F2, F5, and F6) disposed in the first region may be smaller than the distance L3 between the active fins (e.g., F3 and F4) disposed in the second region. Accordingly, the active fins (e.g., F1, F2, F5, and F6) disposed in the first region may protrude from the isolation layer (e.g., 103) by a relatively small distance, and the active fins (e.g., F3 and F4) disposed in the second region may protrude from an isolation layer (e.g., 103) by a relatively large distance.

The first pass transistor PS1 may be defined at intersections of the second gate electrode 252 and the first and second active fins F1 and F2. The second pass transistor PS2 may be defined at intersections of the fourth gate electrode 254 and the fifth and sixth active fins F5 and F6.

Although not specifically illustrated, a plurality of contacts 250 may be formed at opposite sides of the respective intersections of the first to fourth gate electrodes 251-254 and the first to sixth active fins F1, F2, F3, F4, F5, and F6.

Further, a first shared contact 261 may simultaneously connect the third active fin F3, the third gate electrode 253, and a wiring 271 with one another. A second shared contact 262 may simultaneously connect the fourth active fin F4, the first gate electrode 251 and a wiring 272 with one another.

FIG. 7 is a conceptual view illustrating a semiconductor device according to another embodiment of the present inventive concept. The following description will focus on differences between the present and previous embodiments.

Referring to FIG. 7, the semiconductor device 4 according to another embodiment of the present inventive concept may include a logic region 10 and an SRAM forming region 20. Logic devices required for the operation of the semiconductor device 4 may be disposed in the logic region 10 and an SRAM device may be disposed in the SRAM forming region 20.

In some embodiments of the present inventive concept, one of the semiconductor devices according to the aforementioned embodiments of the present inventive concept may be disposed in the SRAM forming region 20. In addition, in some other embodiments of the present inventive concept, a combination of one and another of the semiconductor devices according to the aforementioned embodiments of the present inventive concept may be disposed in the SRAM forming region 20.

In FIG. 7, the logic region 10 and the SRAM forming region 20 are illustrated, but aspects of the present disclosure are not limited thereto. For example, the present inventive concept may also be applied to the logic region 10 and a region where other types of memories (e.g., DRAM, MRAM, RRAM, PRAM, etc.) are formed.

Figure 8:
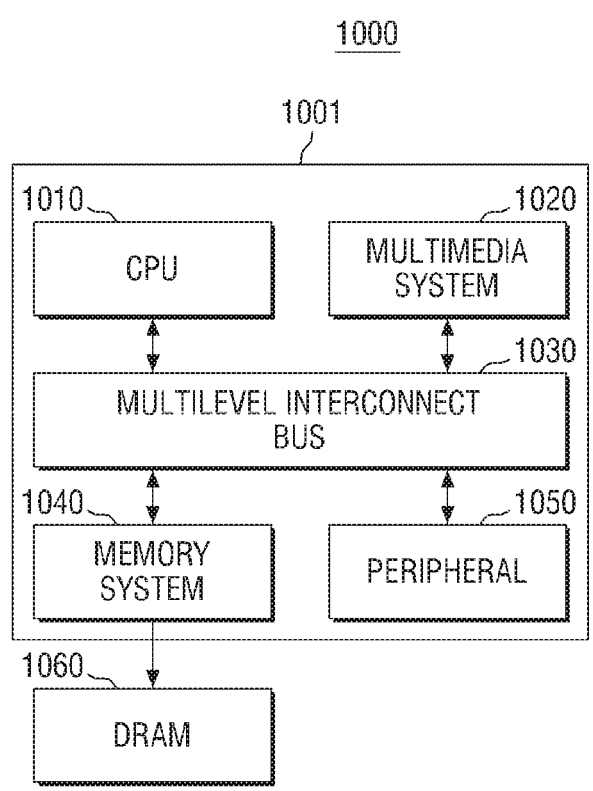
FIG. 8 is a block diagram of an SoC system including semiconductor devices according to some embodiments of the present inventive concept.

FIG. 8 is a block diagram of an SoC system including semiconductor devices according to some embodiments of the present inventive concept.

Referring to FIG. 8, the SoC system 1000 may include an application processor 1001 and a DRAM 1060.

The application processor 1001 may include a central processing unit (CPU) 1010, a multimedia system 1020, a multilevel interconnect bus 1030, a memory system 1040, and a peripheral circuit (PERIPHERAL) 1050.

The CPU 1010 may perform operations necessary for operating the SoC system 1000. In some embodiments of the present inventive concept, the CPU 1010 may be configured in a multi-core environment including a plurality of cores.

In the embodiment, the CPU 1010 may include, for example, a cache memory including SRAM. The cache memory may include an L1 cache memory and a L2 cache memory. The aforementioned semiconductor devices according to the embodiments of the present inventive concept may be employed as components of the cache memory.

The multimedia system 1020 may be used in performing a variety of multimedia functions in the SoC system 1000. The multimedia system 1020 may include a 3D engine module, a video codec, a display system, a camera system, and a post-processor.

The multilevel interconnect bus 1030 may be used in performing data communication among the CPU 1010, the multimedia system 1020, the memory system 1040, and the peripheral circuit 1050. In some embodiments of the present inventive concept, the multilevel interconnect bus 1030 may have a multi-layered structure. In detail, examples of the multilevel interconnect bus 1030 may include a multi-layer advanced high-performance bus (AHB), or a multi-layer advanced eXtensible interface (AXI), but aspects of the present disclosure are not limited thereto.

The memory system 1040 may provide environments used for high-speed operation by connecting the AP 1001 to an external memory (for example, the DRAM 1060). In some embodiments of the present inventive concept, the memory system 1040 may include a separate controller (for example, a DRAM controller) for controlling the external memory (for example, the DRAM 1060).

The peripheral circuit 1050 may provide environments necessary for connecting the SoC system 1000 to an external device (for example, a main board). Accordingly, the peripheral circuit 1050 may include various kinds of interfaces enabling the external device connected to the SoC system 1000 to be compatibly used.

The DRAM 1060 may function as a working memory required to operate the AP 1001. In some embodiments of the present inventive concept, as shown, the DRAM 1060 may be disposed outside the AP 1001. In detail, the DRAM 1060 may be packaged with the AP 1001 in the form of a package on package (PoP).

At least one of the components of the SoC system 1000 may employ one of the aforementioned semiconductor devices according to embodiments of the present inventive concept.

Figure 9:
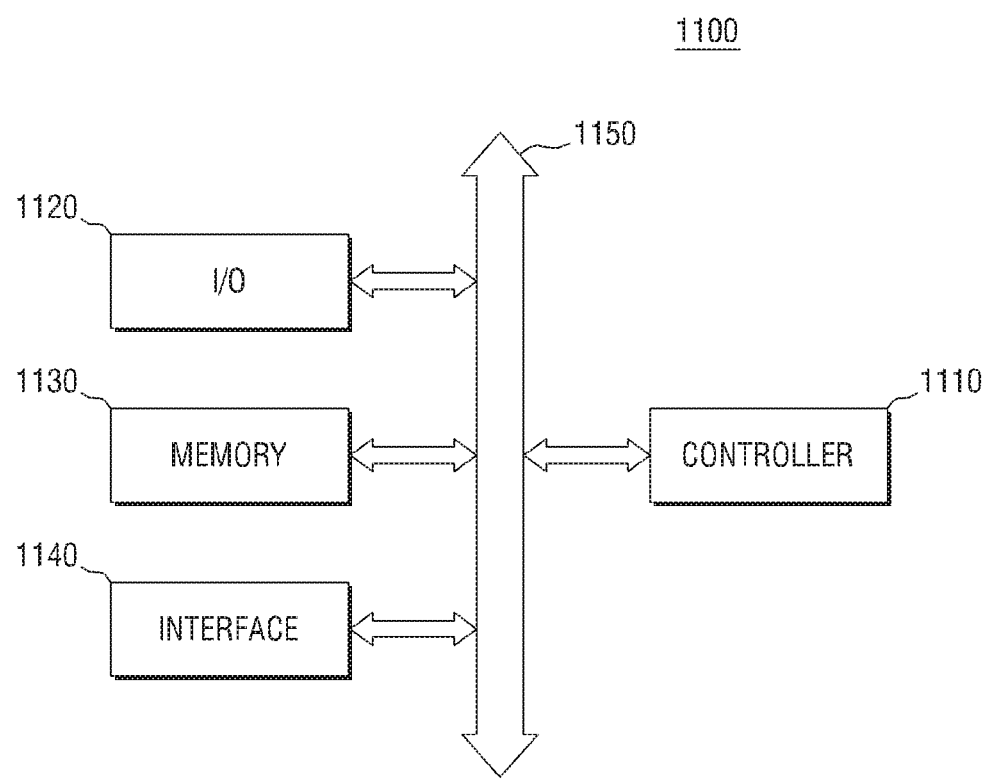
FIG. 9 is a block diagram of an electronic system including semiconductor devices according to some embodiments of the present inventive concept.

FIG. 9 is a block diagram of an electronic system including semiconductor devices according to some embodiments of the present inventive concept.

Referring to FIG. 9, the electronic system 1100 may include a controller 1110, an input/output device (I/O) 1120, a memory 1130, an interface 1140 and a bus 1150. The controller 1110, the I/O 1120, the memory 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on.

Although not shown, the electronic system 1100 may further include high-speed DRAM and/or SRAM as the working memory for improving the operation of the controller 1110. Here, a semiconductor device according to embodiments of the present inventive concept may be employed as the working memory. For example, when the electronic system 1100 includes a high-speed SRAM, a semiconductor device according to embodiments of the present inventive concept may be used as the high-speed SRAM.

In addition, a semiconductor device according to embodiments of the present inventive concept may be provided in the memory device 1130 or may be provided as some components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 10:
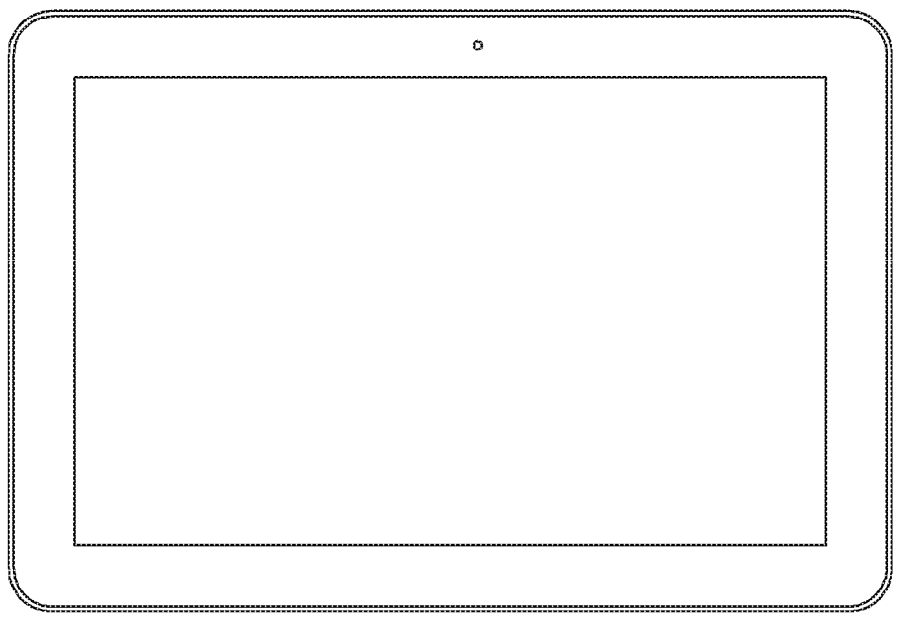
FIGS. 10 to 12 illustrate exemplary semiconductor systems to which semiconductor devices according to some embodiments of the present inventive concept can be applied.
Figure 11:
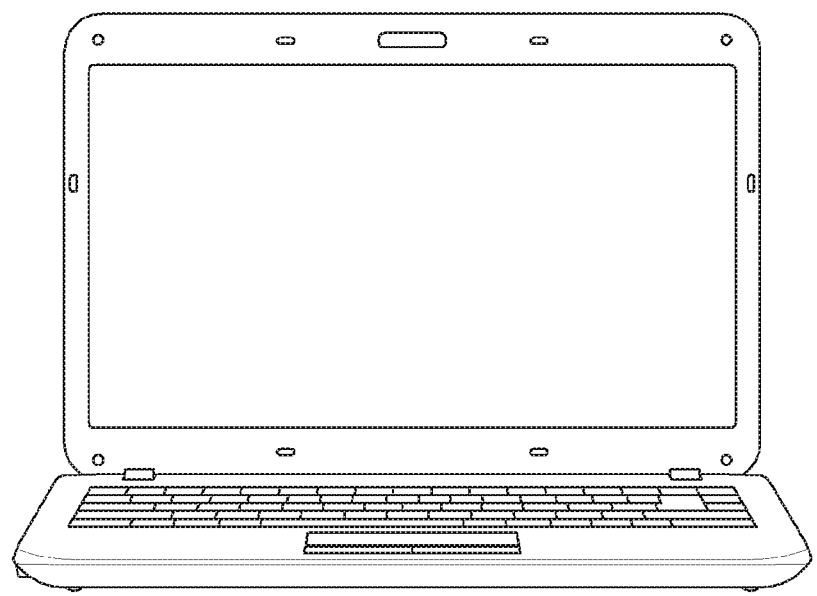
Figure 12:
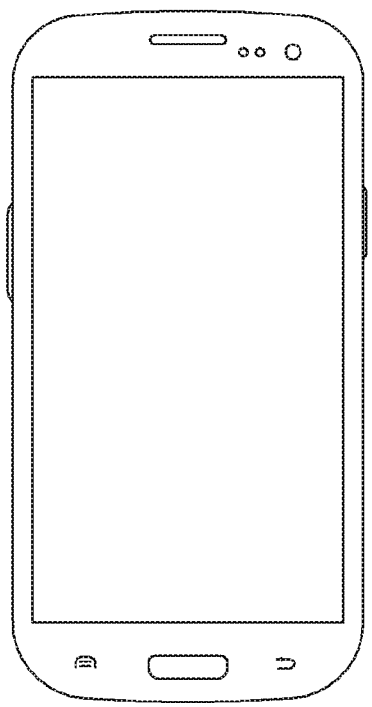

FIGS. 10 to 12 illustrate exemplary semiconductor systems to which semiconductor devices according to some embodiments of the present inventive concept can be applied.

FIG. 10 illustrates an example in which a semiconductor device according to an embodiment of the present inventive concept is applied to a tablet PC (1200), FIG. 11 illustrates an example in which a semiconductor device according to an embodiment of the present inventive concept is applied to a notebook computer (1300), and FIG. 12 illustrates an example in which a semiconductor device according to an embodiment of the present inventive concept is applied to a smart phone (1400). At least one of the semiconductor devices according to some embodiments of the present inventive concept can be employed in a tablet PC 1200, a notebook computer 1300, a smart phone 1400, and the like.

In addition, it will be understood that the semiconductor devices according to some embodiments of the present inventive concept may also be applied to other IC devices not illustrated herein.

That is to say, in the above-described embodiments, only the tablet PC 1200, the notebook computer 1300 and the smart phone 1400 have been exemplified as including semiconductor devices according to the embodiments of the present inventive concept, but embodiments of the present disclosure are not limited thereto.

In some embodiments of the present inventive concept, semiconductor devices described herein may be implemented in a computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, or the like.

FIG. 4 and FIGS. 13 to 31 illustrate intermediate process steps for illustrating a method for fabricating semiconductor devices according to some embodiments of the present inventive concept.

Figure 13:
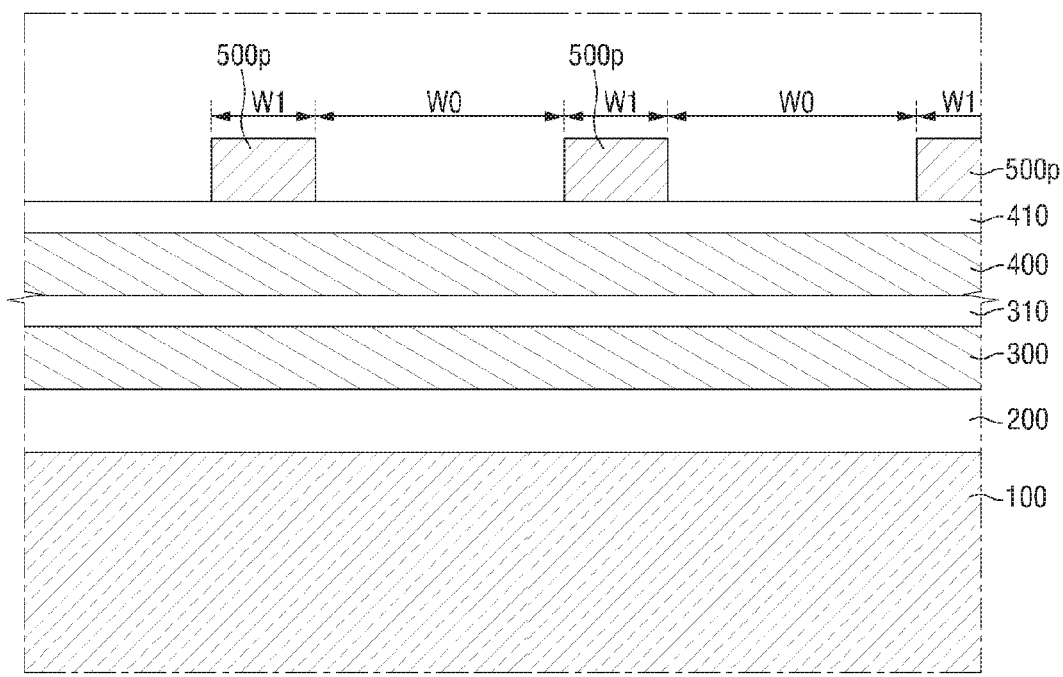
FIGS. 13 to 29 are diagrams of intermediate process steps that illustrate a method for fabricating semiconductor devices according to some embodiments of the present inventive concept.

Referring to FIG. 13, a hard mask layer 200, first sacrificial layer 300, a first anti-reflection layer 310, a second sacrificial layer 400 and a second anti-reflection layer 410 may be sequentially formed on the substrate 100.

The substrate 100 may be a general semiconductor substrate, such as a silicon wafer. In addition, the substrate 100 may be a silicon on insulator (SOI) substrate.

The hard mask layer 200 may include a plurality of layers. Each of the plurality of layers may include at least one material selected from the group consisting of silicon oxide ($SiO_x$), silicon oxynitride (SiON), silicon nitride ($Si_xN_y$), tetraethylorthosilicate (TEOS) and polysilicon, a carbon-containing material including amorphous carbon layer (ACL), a spin-on hardmask (SOH), and a metal. Among the plurality of layers, lower layers may be, for example, silicon nitride layers. The lower layers may further include, for example, a thin silicon oxide layer formed under the silicon nitride layers. Intermediate layers may include silicon oxide and upper layers may include polysilicon, but embodiments of the present disclosure are not limited thereto.

Figure 15:
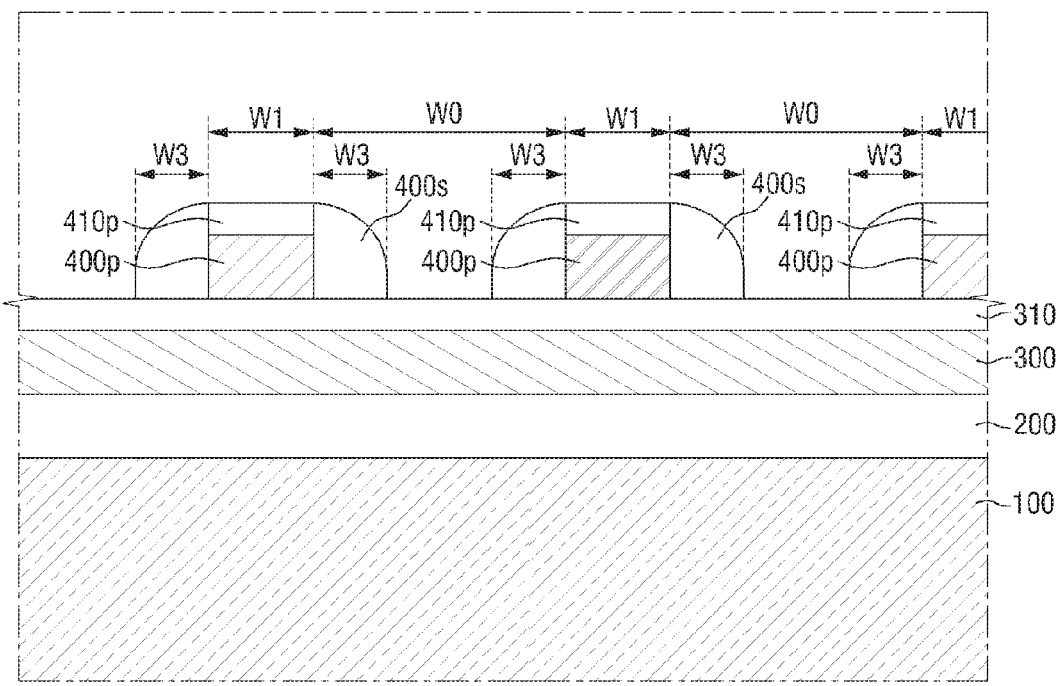
Figure 18:
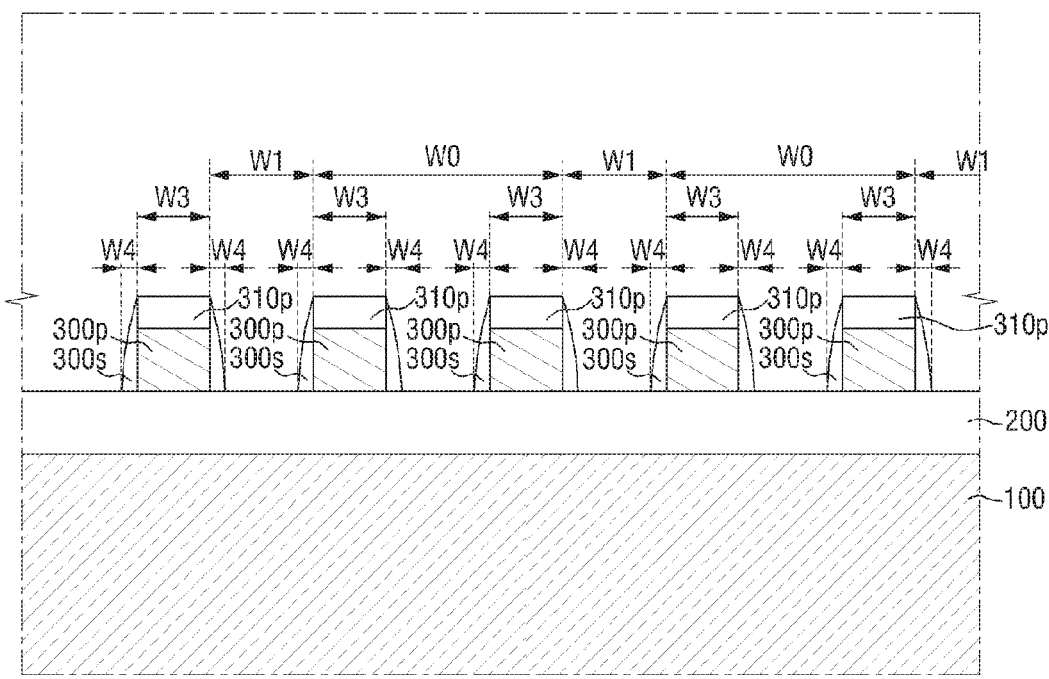

The first and second sacrificial layers 300 and 400 are layers for forming first spacers 400s and second spacers 300s in subsequent processes (see FIGS. 15 and 18). The first and second sacrificial layers 300 and 400 may include one of polysilicon, a amorphous carbon layer (ACL) or a spin-on hardmask (SOH).

The first and second anti-reflection layers 310 and 410 are layers for reducing or preventing light from being reflected by underlying layers during a photolithography process. The first and second anti-reflection layers 310 and 410 may include silicon oxynitride (SiON).

The hard mask layer 200, the first and second sacrificial layers 300 and 400 and the first and second anti-reflection layers 310 and 410 may be formed by atomic layer deposition (ALD), chemical vapor deposition (CVD) or spin coating. According to the materials used, baking or curing may further be performed.

Next, the second sacrificial layer 400 is covered by photoresist PR, thereby forming a line-shaped photoresist film pattern 500p through a photolithography process. The photoresist film pattern 500p may include a plurality of photoresist film patterns. The plurality of photoresist film patterns 500p may be spaced apart from each other.

The plurality of photoresist film patterns 500p may have the same width W1. That is to say, the plurality of photoresist film patterns 500p may have the same width to make active patterns forming an SRAM cell region in a later process have constant intervals. An interval W0 of each of the plurality of photoresist film patterns 500p may be greater than the width W1, but aspects of the present disclosure are not limited thereto. The width W1 or the interval W0 of the plurality of photoresist film patterns 500p may be adjusted for arrangement of active fins to be formed later.

Figure 14:
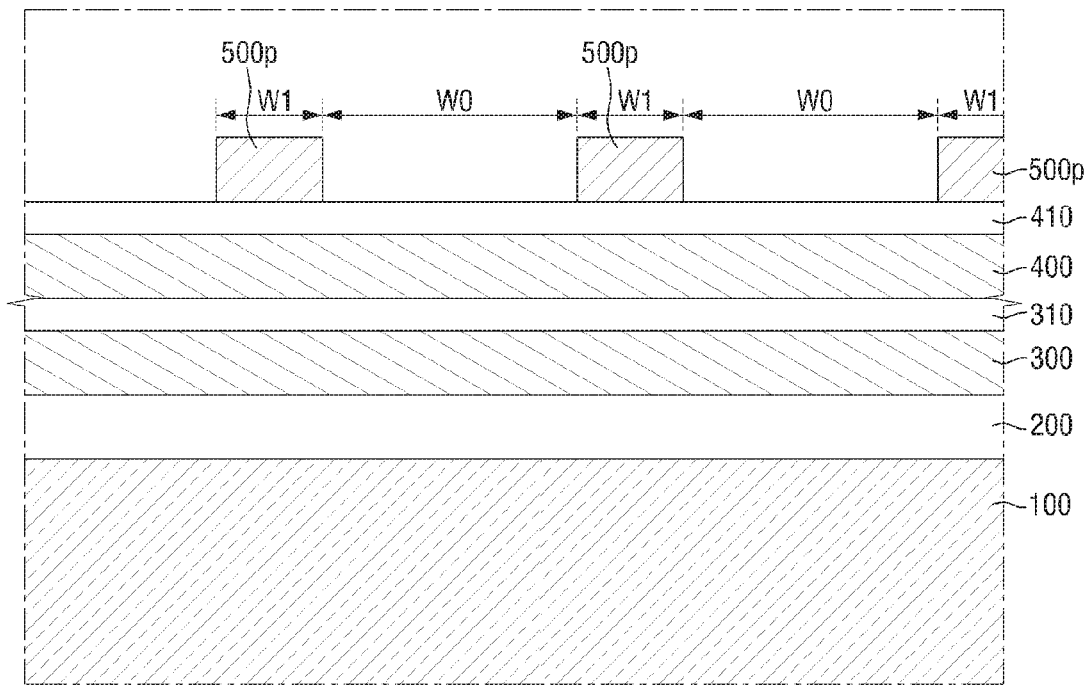

Referring to FIG. 14, the second anti-reflection layer 410 and the second sacrificial layer 400 are anisotropically etched using the photoresist film patterns 500p as etch masks, thereby forming a line-shaped first mandrel 400p on the first sacrificial layer 300. The first mandrel 400p includes a plurality of first mandrels spaced apart from each other. The plurality of first mandrels 400p may have the same width and interval with the photoresist film pattern 500p.

Referring to FIG. 15, first spacers 400s may be formed on sidewalls of the first mandrels 400p.

In detail, the first spacers 400s may be formed on sidewalls of the first mandrels 400p by forming a first spacer material layer conformally covering the first mandrels 400p, followed by performing an etchback process. A width W3 of each of the first spacers 400s may be determined in consideration of a distance between the active patterns intended to be finally formed. The interval between the active patterns intended to be finally formed may be narrower than a resolution limit of commercial photolithography equipment.

The first spacers 400s may include a material having etching selectivity with respect to the first mandrels 400p. For example, when the first mandrels 400p include one of polysilicon, amorphous carbon layer (ACL) and a spin-on hardmask (SOH), the first spacer material layer may include silicon oxide or silicon nitride. The first spacer material layer may be formed by atomic layer deposition (ALD).

Figure 16:
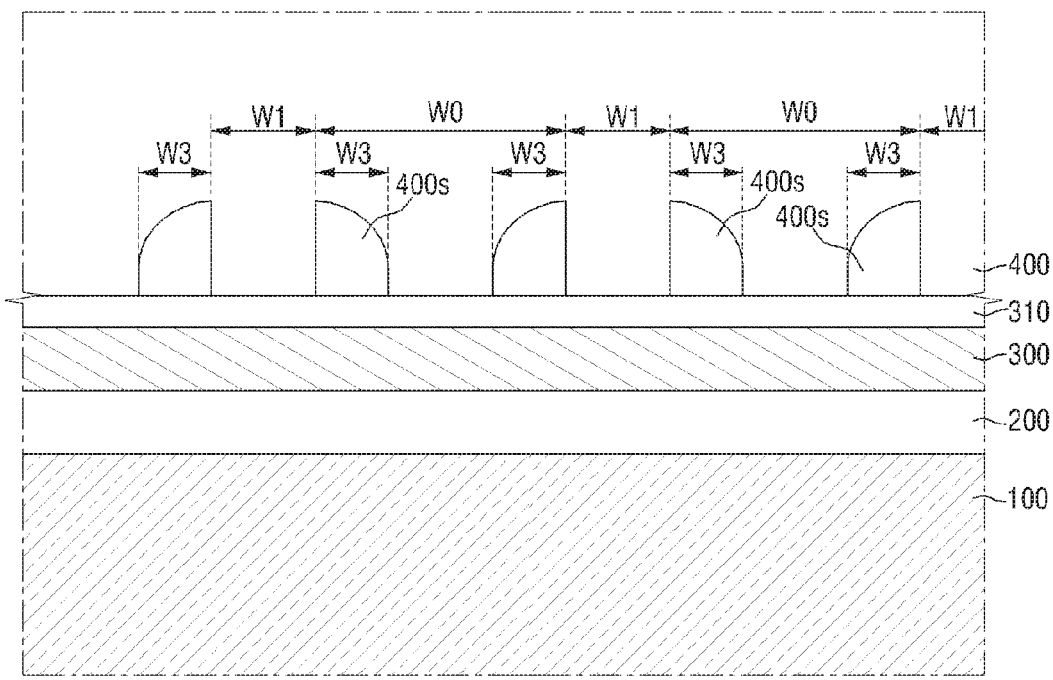

Referring to FIG. 16, the first mandrels 400p may be selectively removed, thereby forming the first spacers 400s remaining on the first sacrificial layer 300 in line types. Because the first spacers 400s have etching selectivity with respect to the first mandrels 400p under particular etching conditions, the first mandrels 400p may be selectively removed.

Figure 17:
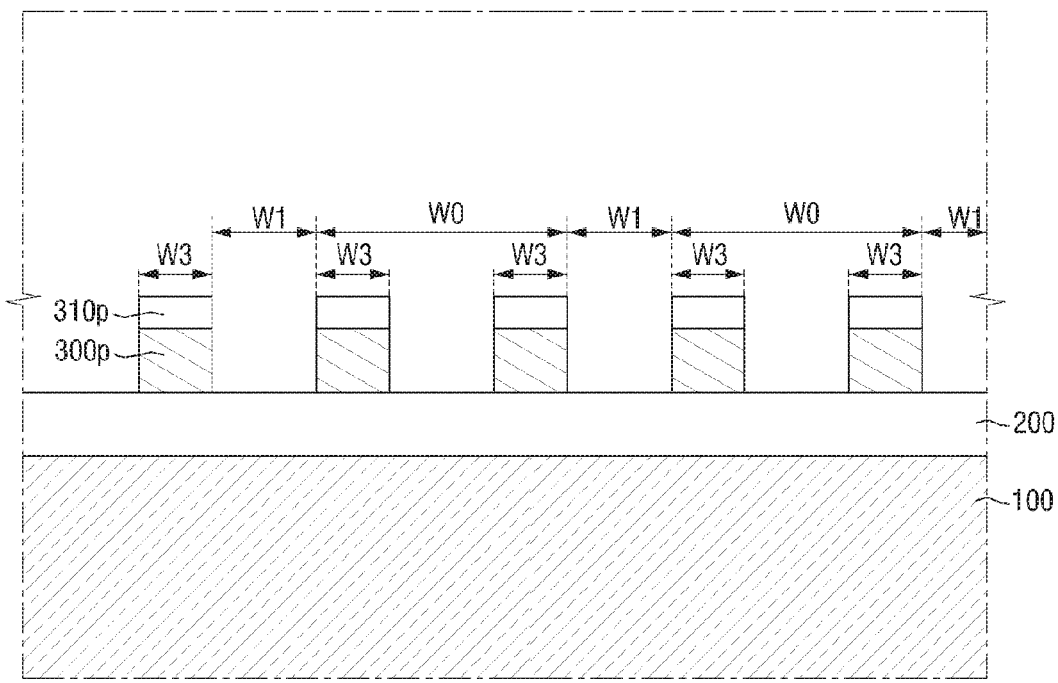

Referring to FIG. 17, second mandrels 300p may be formed on the hard mask layer 200.

The first anti-reflection layer 310 and the first sacrificial layer 300 are etched using the first spacers 400s as etch masks, thereby forming second mandrels 300p on the hard mask layer 200. A width of each of the second mandrels 300p may be equal to the width W3 of each of the first spacers 400s. As shown, the plurality of second mandrels 300p may have the same width, i.e., W3.

Referring to FIG. 18, the second spacers 300s may be formed on sidewalls of the second mandrels 300p.

In detail, the second spacers 300s may be formed on sidewalls of the second mandrels 300p by forming a second spacer material layer conformally covering the second mandrels 300p, followed by performing an etch back process. A width W4 of the second spacer material layer may be determined in consideration of a line width between the active patterns intended to be finally formed. The line width between the active patterns intended to be finally formed may be narrower than a resolution limit of commercial photolithography equipment.

The second spacer material layer may include a material having etching selectivity with respect to the second mandrels 300p. For example, when the second mandrels 300p include one of polysilicon, amorphous carbon layer (ACL) and a spin-on hardmask (SOH), the second spacer material layer may include silicon oxide or silicon nitride. The second spacer material layer may be formed by atomic layer deposition (ALD).

Figure 19:
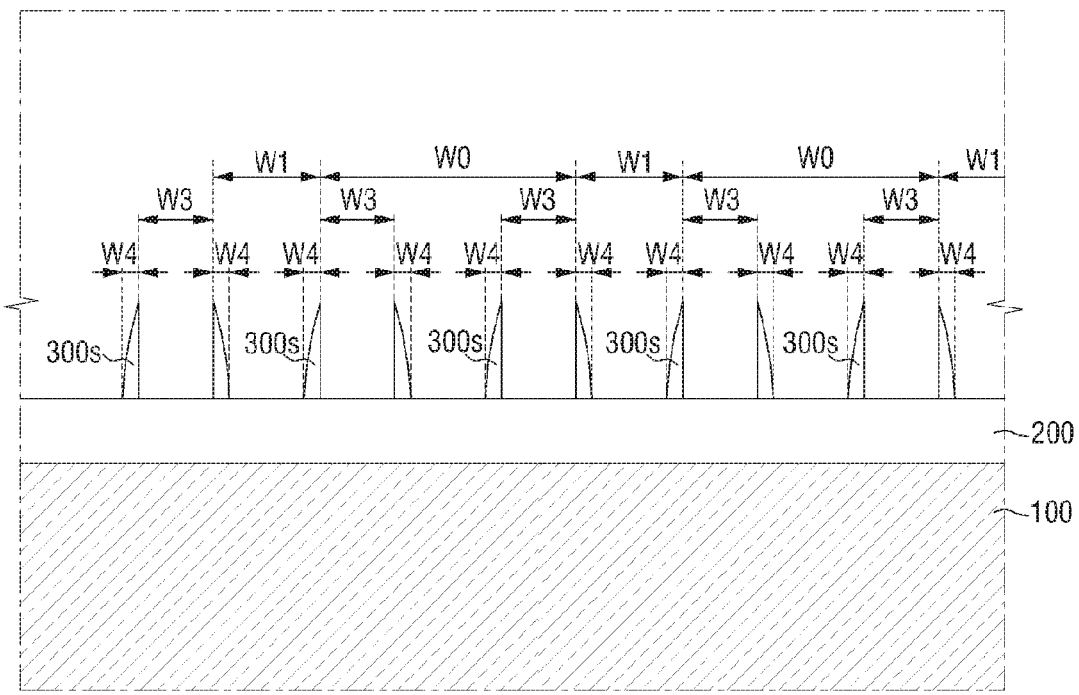

Referring to FIG. 19, the second mandrels 300p may be selectively removed, thereby forming the second spacers 300s remaining on the hard mask layer 200 in line types. Because the second spacers 300s have etching selectivity with respect to the second mandrels 300p, the second mandrels 300p may be selectively removed.

As the second mandrels 300p are removed, the second spacers 300s remaining in line types may be formed. The second spacers 300s may have the same pitch.

Figure 20:
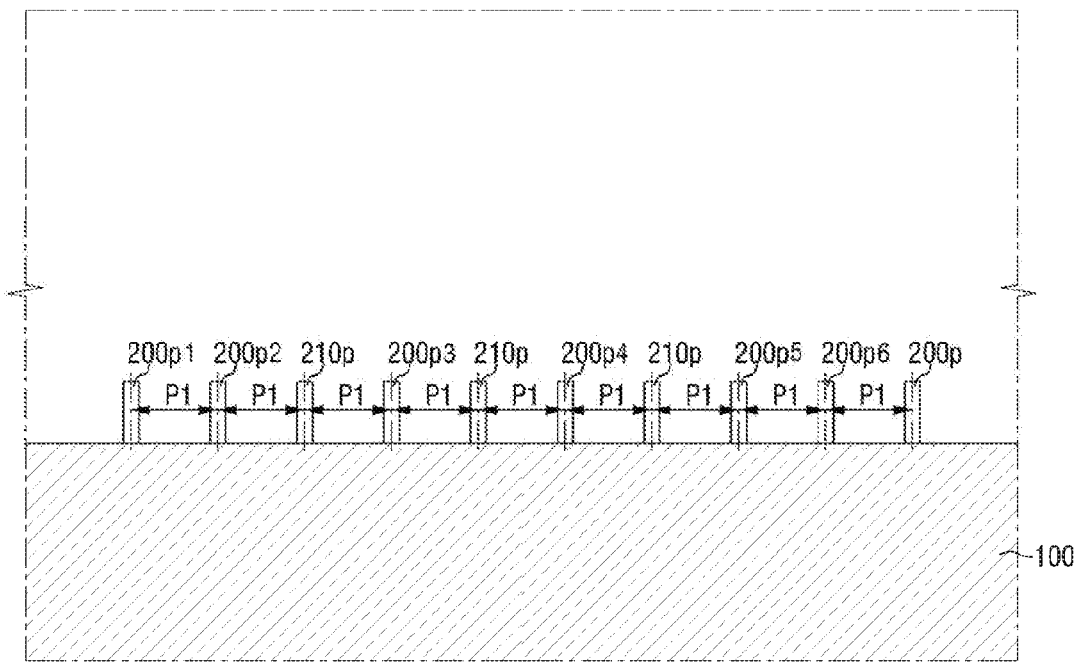

Referring to FIG. 20, the hard mask layer 200 is anisotropically etched using the second spacers 300s as etch masks, thereby forming hard mask patterns 200p, 200p1 to 200p6, and 210p having the same pitch on the substrate 100. The hard mask patterns 200p, 200p1 to 200p6, and 210p may include a plurality of hard mask patterns, which are spaced apart from each other at the same pitch P1.

The hard mask patterns 200p, 200p1 to 200p6, and 210p may include real mask patterns 200p1 to 200p6, and 200p and a dummy mask pattern 210p. The real mask patterns 200p1 to 200p6, and 200p may be patterns for transferring the active patterns F1 to F7 on the substrate 100 in a later process. The dummy mask pattern 210p may be a pattern to be removed in a later process. The dummy mask pattern 210p may be positioned between each of the real mask patterns 200p1 to 200p6, and 200p. The real mask patterns 200p1 to 200p6, and 200p may include first to sixth real mask patterns 200p1 to 200p6 and an STI real mask pattern 200p, which are sequentially arranged in that order. The dummy mask pattern 210p may be positioned between the second and third real mask patterns 200p2 and 200p3, between the third and fourth real mask patterns 200p3 and 200p4 and between the fourth and fifth real mask patterns 200p4 and 200p5. A distance between the second and third real mask patterns 200p2 and 200p3 may correspond to a distance between a pull-down transistor and a pull-up transistor, and a distance between the third and fourth real mask patterns 200p3 and 200p4 may correspond to a distance between pull-up transistors. In addition, a distance between the fourth and fifth real mask patterns 200p4 and 200p5 may correspond to a distance between a pull-up transistor and a pull-down transistor. That is to say, a greater distance than P1 may exist between the pull-down transistor and the pull-up transistor and between pull-up transistors. The STI real mask pattern 200p may be formed at a position where an isolation layer is to be formed later.

Figure 21:
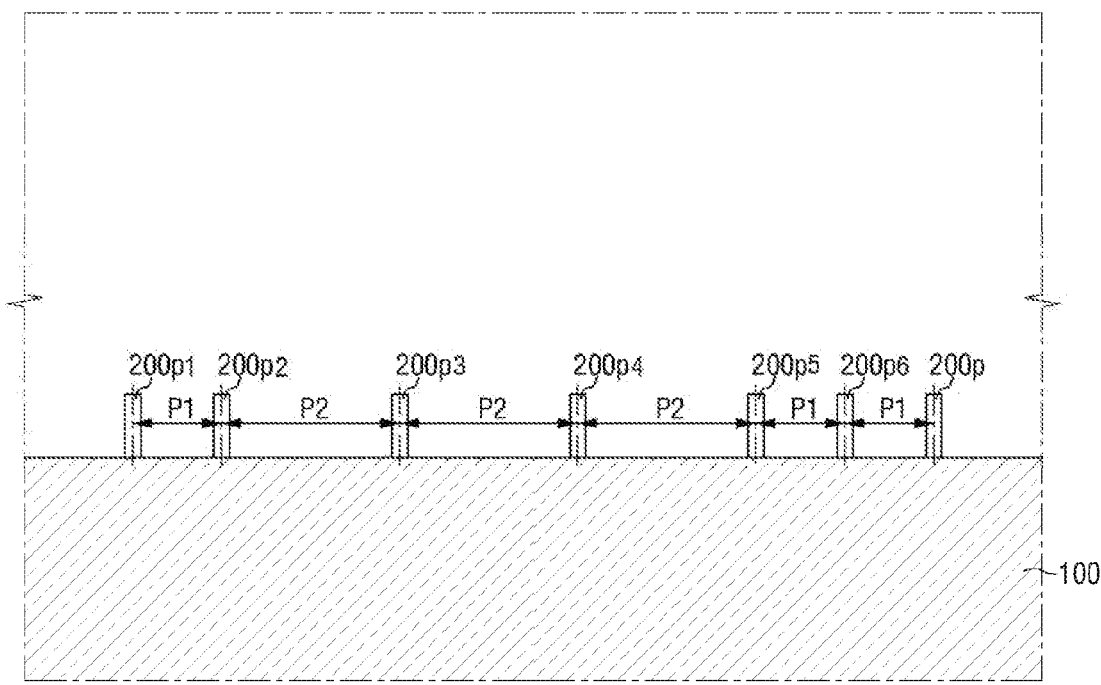

Referring to FIG. 21, the dummy mask pattern 210p is removed so that only the real mask patterns 200p1 to 200p6 and 200p remain. A distance between the first and second real mask patterns 200p1 and 200p2 may be a first pitch P1, which may be equal to a distance between the fifth and sixth real mask patterns 200p5 to 200p6 and may also be equal to a distance between the sixth real mask pattern 200p6 and the STI real mask pattern 200p.

A distance between each of the second to fifth real mask patterns 200p2 to 200p5 may be a second pitch P2. The second pitch P2 may be twice the first pitch P1.

Figure 22:
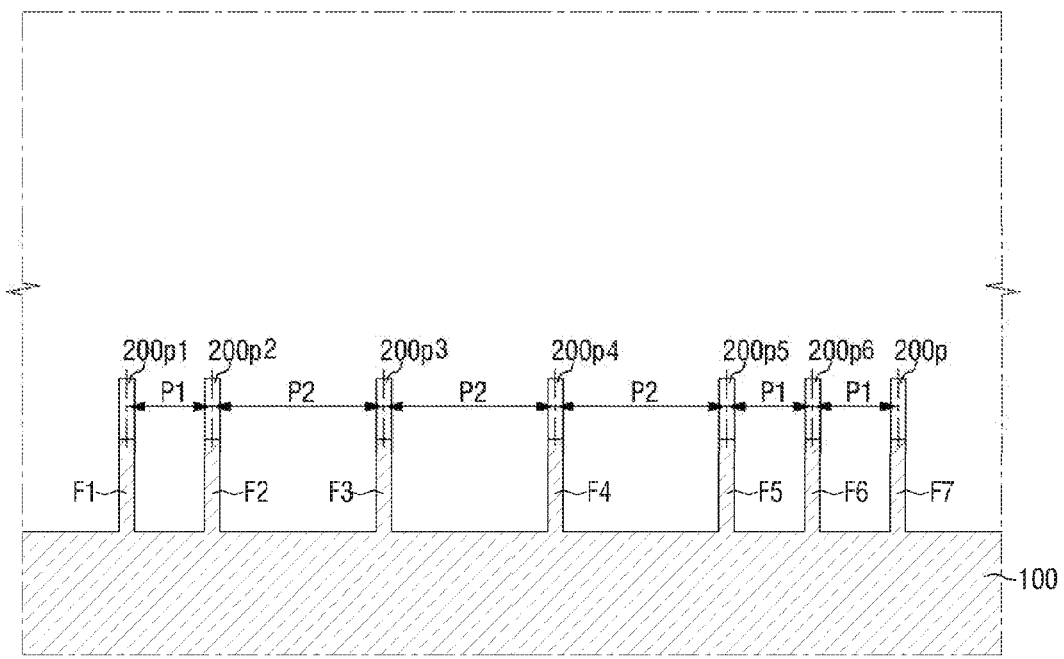

Referring to FIG. 22, at least a portion of the substrate 100 is anisotropically etched, thereby forming active patterns F1 to F7 having different pitches on the substrate 100.

The second spacers 300s may be transferred to the substrate 100 by anisotropically etching the substrate 100, thereby forming the active patterns F1 to F7. The first to sixth active patterns F1 to F6 may be formed by the first to sixth real mask patterns 200p1 to 200p6 and the seventh active pattern F7 may be formed by the STI real mask pattern 200p.

First, hard mask layers are etched using the second spacers 300s having different pitches as etch masks, thereby forming the hard mask patterns 200p, 200p1 to 200p6, and 210p having the same pitch. Next, the hard mask patterns 200p, 200p1 to 200p6, and 210p are selectively etched and the substrate 100 is anisotropically etched using the remaining hard mask patterns 200p, 200p1 to 200p6, and 210p as an etch mask, thereby forming the active patterns F1 to F7 having different pitches. After the anisotropically etching of the substrate 100 is completed, the real mask patterns 200p1 to 200p6, and 200p may remain on the active patterns F1 to F7.

Figure 23:
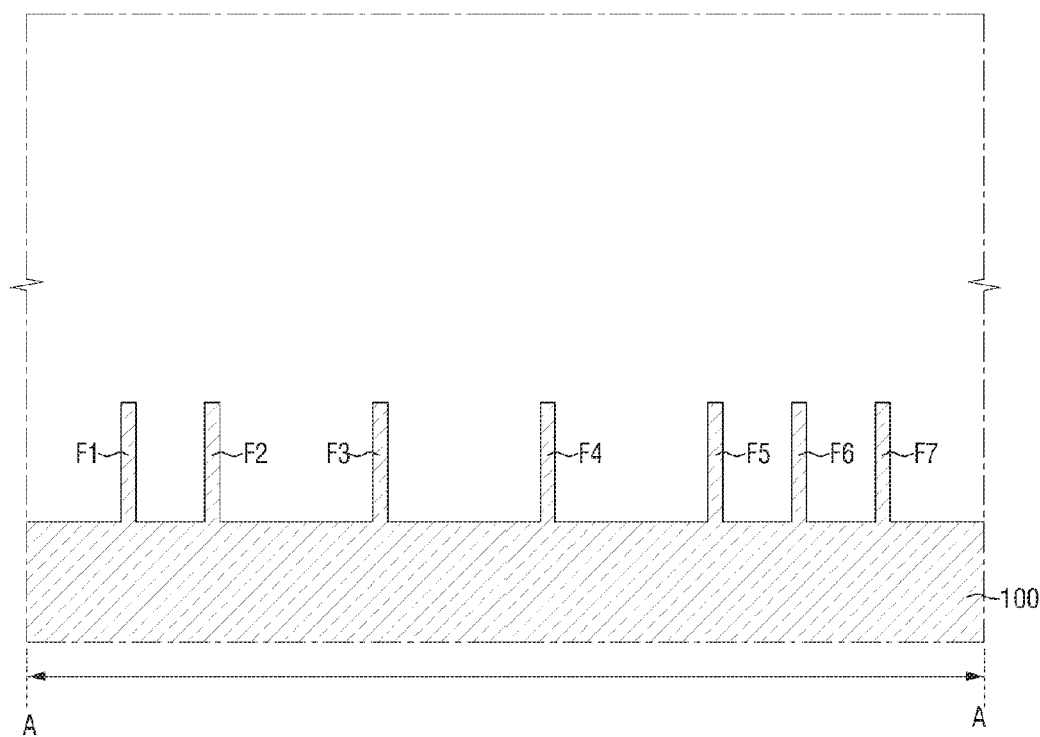

Referring to FIG. 23, the seventh active pattern F7 may be removed and an isolation layer 103 may be formed to allow top portions of the first to sixth active patterns F1 to F6 to protrude.

A trench may be formed at a place produced by removing the seventh active pattern F7. The trench may become an isolation layer in a later process.

An insulation layer is formed, the insulation layer filling a shallow trench between each of the active patterns F1 to F7 formed by anisotropically etching the substrate 100, followed by performing a planarization process to expose the hard mask pattern 200p, thereby forming a preliminary isolation layer.

Next, a deep trench may further be formed and an insulation layer may then be formed to fill the deep trench. At this stage, the STI real mask pattern 200p and the seventh active pattern F7 may be removed. Next, the planarization process is performed to expose the first to sixth real mask patterns 200p1 to 200p6, thereby forming the isolation layer 103, but embodiments of the present disclosure are not limited thereto. According to other embodiments, the deep trench may not be formed.

The insulation layer may include at least one of borophosphor silica glass (BPSG), high density plasma (HDP), flowable oxide (FOX), tonen silazene (TOSZ), spin on glass (SOG), undoped silicate glass (USG), tetraethyl orthosilicate (TEOS), and low temperature oxide (LTO). The planarizing may be performed by chemical mechanical polishing (CMP).

Next, after removing the first to sixth real mask patterns 200p1 to 200p6 remaining on the first to sixth active patterns F1 to F6, the isolation layer 103 may be etched to a predetermined depth to allow the top portions of the first to sixth active patterns F1 to F6 to protrude. Here, top surfaces and both side surfaces of the first to sixth active patterns F1 to F6 may be partially exposed.

Because a fin-cut process is not performed on the top surface of the substrate 100 between each of the first to sixth active patterns F1 to F6, a trench is not formed at all. Conversely, a fin-cut process may be performed from the outside of the first to sixth active patterns F1 to F6, that is, in a direction in which the first active pattern F1 and the sixth active pattern F6 are opposed to each other, thereby forming a trench. That is to say, there is no step difference on the top surface of the substrate 100 between the first to sixth active fins F1 to F6.

FIGS. 24 to 28 illustrate performance results of the processes described in FIGS. 13 to 23. Specifically, FIGS. 24 to 28 are cross-sectional views taken along lines A-A and B-B of FIG. 4.

Figure 24:
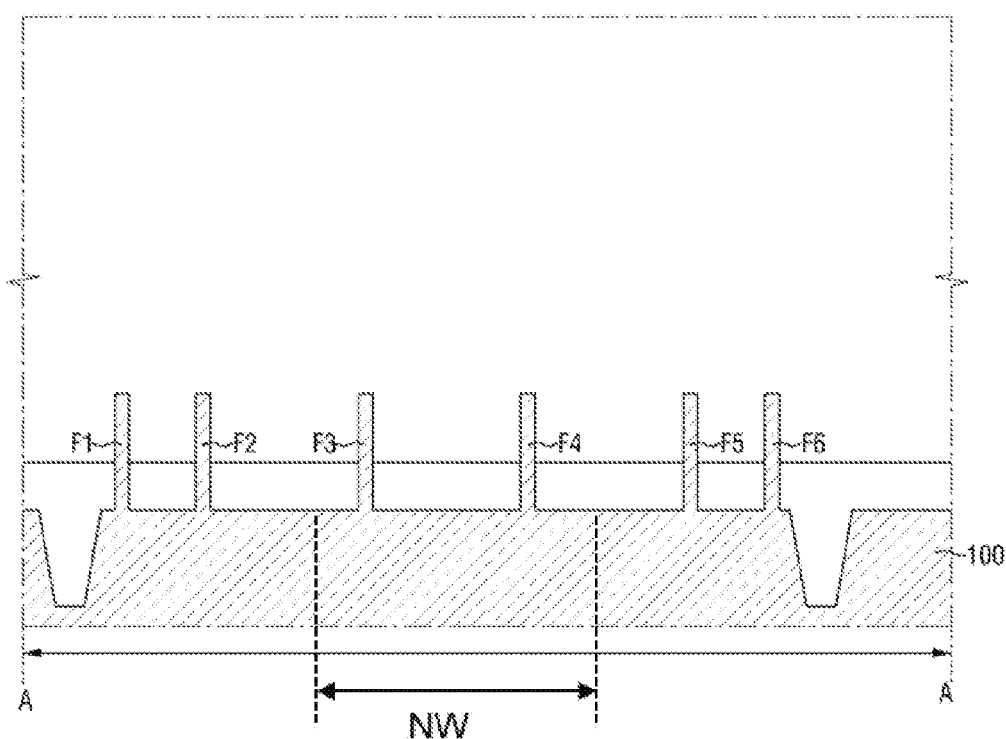

Referring to FIG. 24, the substrate 100 may include an N-well region (NW). Regions other than the N-well region NW may be regions doped with P-type impurities. The N-well region NW may be previously formed before forming the active patterns F1 to F7.

Figure 25:
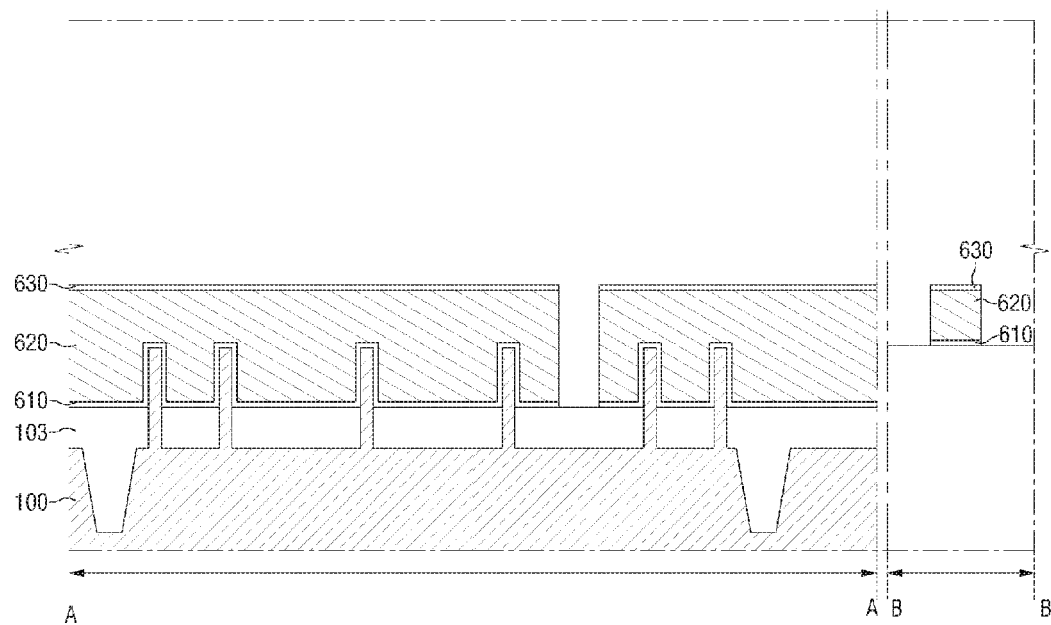

Referring to FIG. 25, a sacrificial gate insulation layer 610, covering the first to sixth active patterns F1 to F6 exposed on the isolation layer 103, and a sacrificial gate electrode 620, may be formed.

First, the sacrificial gate insulation layer 610, the sacrificial gate electrode 620 and a mask layer 630 may be sequentially formed. Next, after patterning the mask layer 630, the sacrificial gate electrode 620 may be patterned using the patterned mask layer as an etch mask.

The sacrificial gate insulation layer 610 may include at least one of a silicon oxide layer and a silicon oxynitride layer, but embodiments of the present disclosure are not limited thereto. The sacrificial gate electrode layer 620 may include polysilicon, but embodiments of the present disclosure are not limited thereto.

Figure 26:
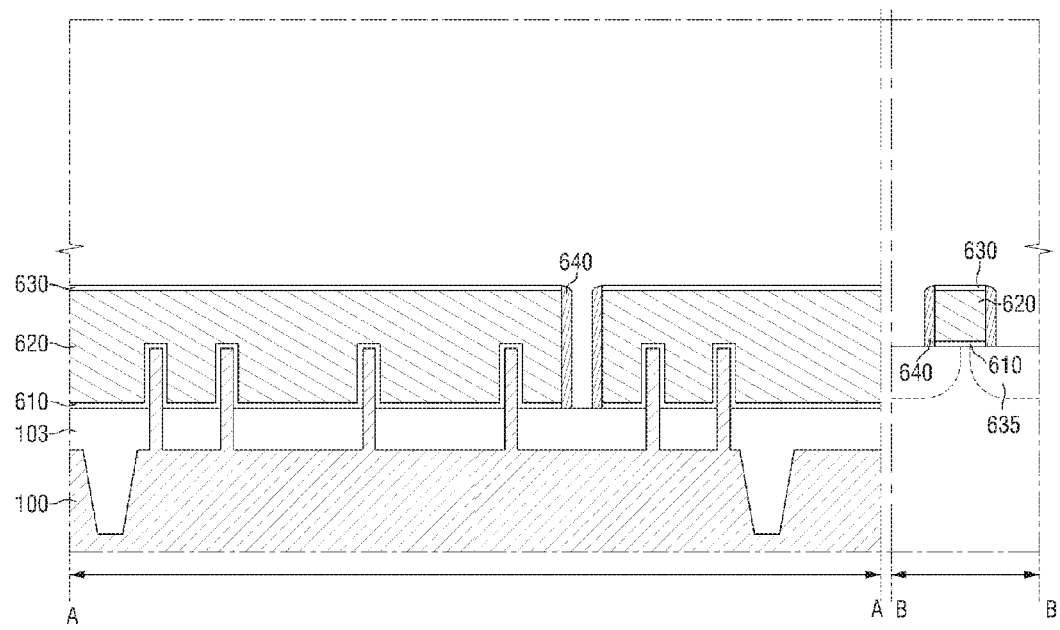

Referring to FIG. 26, a gate spacer 640 may be formed on side surfaces of the sacrificial gate electrode 620 and a source/drain region 635 may be formed in the active patterns exposed to the side surfaces of the sacrificial gate electrode 620.

First, after a spacer material layer is conformally formed on the sacrificial gate electrode 620, the spacer material layer is etched back, thereby forming the gate spacer 640. Next, impurities are ion-implanted, thereby forming the source/drain region 635. To activate the impurities, a heat treatment process may be performed after the ion-implanting.

Figure 27:
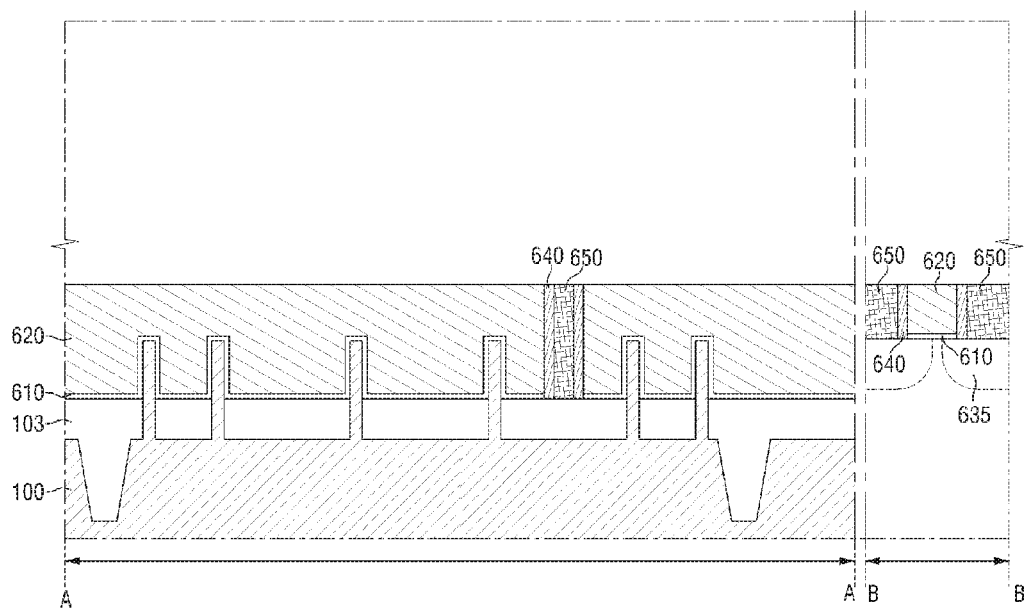

Referring to FIG. 27, an interlevel insulation layer 650 may be formed, the interlevel insulation layer 650 surrounding the sacrificial gate electrode 620 and the gate spacer 640 and exposing a top surface of the sacrificial gate electrode 620.

First, after forming the interlevel insulation layer 650 covering the sacrificial gate electrode 620 and the gate spacer 640, a planarization process may be performed to expose the top surface of the sacrificial gate electrode 620. Through the planarization process, the interlevel insulation layer 650 may be completed.

The planarization process performed on the interlevel insulation layer 650 may be a chemical mechanical polishing (CMP) process.

Figure 28:
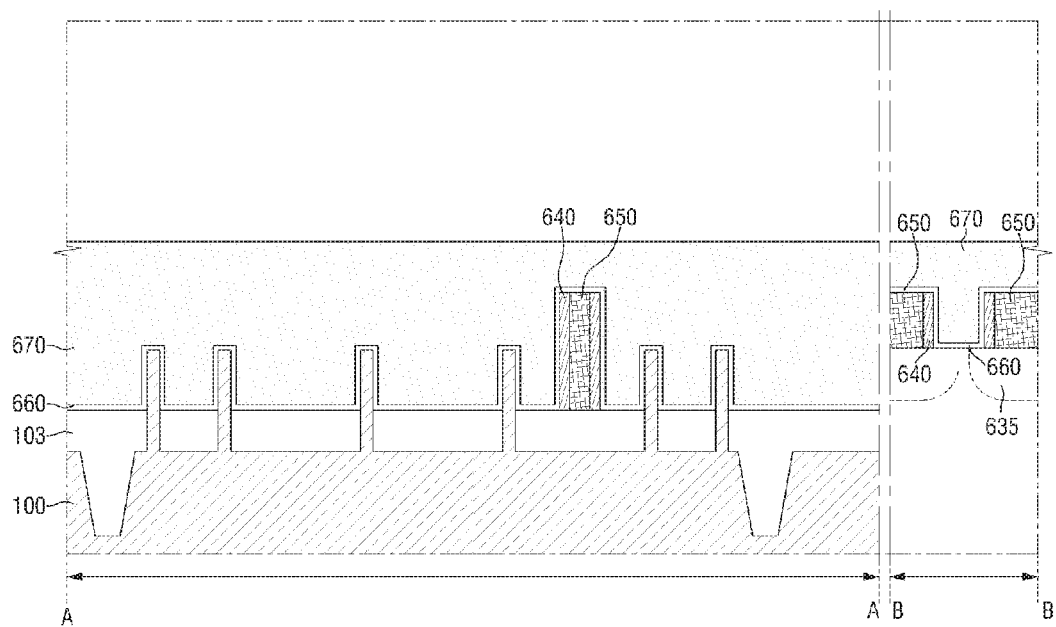
Figure 29:
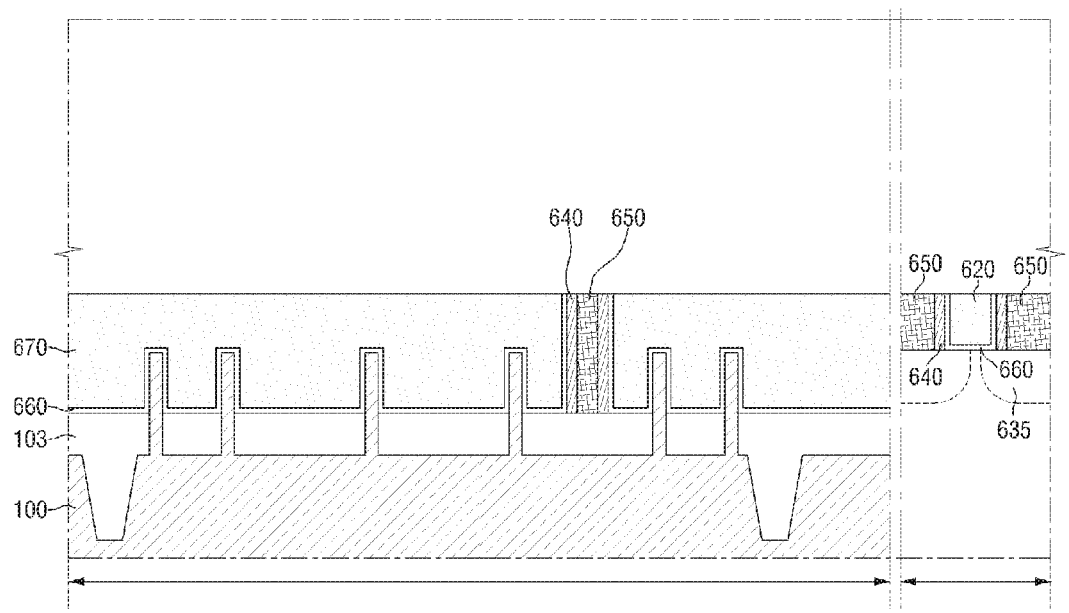

Referring to FIGS. 28 and 29, a gate insulation layer 660 and a gate electrode 670 may be formed.

First, the sacrificial gate electrode 620 and the sacrificial gate insulation layer 610 may be removed, thereby forming a trench in the interlevel insulation layer 650. The sacrificial gate electrode 620 and the sacrificial gate insulation layer 610 may be conformally formed in the trench. Next, a planarization process may be formed to expose a top surface of the interlevel insulation layer 650. Through the planarization process, the gate electrode 670 may be completed.

The gate insulation layer 660 may include a high-k layer. The high-k layer may include an insulating material having a higher dielectric constant than silicon oxide, and examples thereof may include at least one material selected from the group consisting of tantalum oxide, titanium oxide, hafnium oxide, zirconium oxide, aluminum oxide, yttrium oxide, niobium oxide, hafnium silicate, and zirconium silicate, but embodiments of the present disclosure are not limited thereto. The gate insulation layer 660 may be formed by chemical vapor deposition (CVD) or atomic layer deposition (ALD).

The gate electrode 670 may include at least one work function control layer and at least one gate metal. The work function control layer may include one material selected from the group consisting of TiN, TaN, WN, TiAl, TiAlN, TaC and TiC. The gate metal may include at least one material selected from the group consisting of aluminum (Al), tungsten (W), and molybdenum (Mo). The work function control layer may function as a diffusion preventing layer against the gate metal. The gate electrode 670 may be formed by chemical vapor deposition (CVD) or atomic layer deposition (ALD) according to the material used.

The work function control layer in the N-well region NW may be different from that in the other region (a region doped with a P-type impurity). To this end, additional processes may further be performed.

In the fabricating method of the semiconductor device according to some embodiments of the present inventive concept, a microfabricated SRAM cell may be formed by a self aligned quadruple patterning (SAQP) process. To fabricate an SRAM, a plurality of active patterns spaced a predetermined distance apart from each other, may be used. In existing fabricating methods, a plurality of fins equally spaced apart from each other have been formed and intermediate fins have been cut to increase the distance between each of the fins. However, introduction of the SAQP process may increase a difficulty in cutting active patterns that are very close to each other. That is to say, the yield of a single active pattern removing process may be lowered. Therefore, before forming each active pattern, a hard mask pattern may be previously removed to skip forming of an active pattern, thereby obviating a need for performing a fin-cut process. Accordingly, deterioration in the manufacturing yield of semiconductor devices due to a fin-cut process can be suppressed, and the reliability of the semiconductor device fabricated can be improved.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A method of fabricating a semiconductor device, the method comprising:
    sequentially forming a hard mask layer and a first sacrificial layer on a substrate;
    forming a first mandrel on the first sacrificial layer;
    forming a first spacer on both sidewalls of the first mandrel;
    removing the first mandrel;
    forming a second mandrel by etching the first sacrificial layer using the first spacer as an etch mask;
    forming a second spacer on both sidewalls of the second mandrel;
    removing the second mandrel;
    forming a hard mask pattern by patterning the hard mask layer using the second spacer as an etch mask, the hard mask pattern including first to ninth fin-type mask patterns extending to be parallel with each other in a first direction and sequentially spaced apart from each other in a second direction perpendicular to the first direction;
    removing the third, fifth and seventh fin-type mask patterns;
    forming first to sixth active patterns by etching the substrate using the hard mask pattern as an etch mask; and
    forming a first gate electrode extending in the second direction to intersect the first to fourth active patterns and a second gate electrode extending in the second direction to intersect the third to sixth active patterns and spaced apart from the first gate electrode in the first direction without intersecting the first and second active patterns.

2. The method of claim 1, wherein the forming of the first mandrel comprises:
  forming a second sacrificial layer on the first sacrificial layer; and
  forming the first mandrel by etching the second sacrificial layer.

3. The method of claim 2, further comprising forming an anti-reflection layer between the first and second sacrificial layers.

4. The method of claim 1, wherein a distance between the first active pattern and the second active pattern is less than 40 nm.

5. The method of claim 1, further comprising forming an isolation layer to allow the first to sixth active patterns to protrude from the isolation layer.

6. The method of claim 5, wherein the forming of the isolation layer comprises:
  forming a deep trench on both side surfaces of the active patterns; and
  forming the isolation layer to completely fill the deep trench.

7. The method of claim 1, wherein a top surface of the substrate between each of the second to fifth active patterns is lower than or at a same height as a top surface of the substrate between the first and second active patterns.

8. The method of claim 1, wherein the hard mask pattern comprises first to sixth hard mask patterns corresponding to the first to sixth active patterns, a distance between the first and second hard mask pattern is a first distance, and a distance between each of the second to fifth hard mask pattern is about twice the first distance.

9. The method of claim 1, wherein the first spacer is formed by atomic layer deposition (ALD).

10. A method of fabricating a semiconductor device, the method comprising:
  sequentially forming a hard mask layer and a sacrificial layer on a substrate;
  forming a first mandrel on the sacrificial layer;
  forming a second mandrel spaced apart from the first mandrel by a width of the first mandrel;
  forming fin-type patterns spaced apart from each other by a width of the second mandrel;
  forming first to sixth active fins using the fin-type patterns as etch masks, the first to sixth active fins extending to be parallel with each other in a first direction and sequentially spaced apart from each other in a second direction intersecting the first direction without a step difference formed on a top surface of the substrate between each of the first to sixth active fins; and
  forming a first gate electrode extending in the second direction to intersect the first to fourth active patterns and a second gate electrode extending in the second direction to intersect the third to sixth active patterns and spaced apart from the first gate electrode in the first direction without intersecting the first and second active patterns.

11. The method of claim 10, further comprising forming an isolation layer on both side surfaces of the first to sixth active patterns.

12. The method of claim 11, wherein the forming of the isolation layer comprises:
  forming a trench on both side surfaces of the first to sixth active fins; and
  filling the trench with the isolation layer.

13. The method of claim 10, wherein the top surface of the substrate between the first to sixth active fins is higher than a bottom surface of the trench.

14. The method of claim 10, wherein the distance between the first and second active fins is about half a distance between the second and third active fins.

15. The method of claim 10, wherein distances between the second to fifth active fins are about equal.

16. The method of claim 10, wherein the second mandrel includes a plurality of second mandrels and the plurality of second mandrels have about a same width.

17. The method of claim 10, wherein the forming of the fin-type patterns comprises:
  forming a plurality of pre-patterns spaced apart from each other; and
  forming the fin-type patterns by removing some of the plurality of pre-patterns.

18. The method of claim 17, wherein the plurality of pre-patterns are formed at about equal distances.

19. A method of fabricating a semiconductor device, the method comprising:
  sequentially forming a hard mask layer and a sacrificial layer on a substrate;
  forming a first mandrel on the sacrificial layer;
  forming a second mandrel spaced apart from the first mandrel by a width of the first mandrel;
  forming fin-type patterns spaced apart from each other by a width of the second mandrel;
  forming a mask pattern by etching some of the fin-type patterns;
  forming first to sixth active fins using the mask pattern as an etch mask, the first to sixth active fins extending to be parallel with each other in a first direction and spaced apart from each other in a second direction intersecting the first direction; and
  forming a first gate electrode extending in the second direction to intersect the first to fourth active patterns and a second gate electrode extending in the second direction to intersect the third to sixth active patterns and spaced apart from the first gate electrode in the first direction without intersecting the first and second active patterns,
  wherein a distance between the first and second active fins and a distance between the fifth and sixth active fins are a first distance, and a distance between each of the second to fifth active fins is about twice the first distance.

20. The method of claim 19, wherein the mask pattern includes first to sixth mask patterns, a distance between the first and second mask patterns and a distance between the fifth and sixth mask patterns are the first distance, and a distance between each of the second to fifth mask patterns is about twice the first distance.

* * * * *